(12) United States Patent
Cho

(10) Patent No.: US 12,266,669 B2
(45) Date of Patent: Apr. 1, 2025

(54) IMAGE SENSING DEVICE HAVING LENS WITH PLURALITY OF PORTIONS EACH CORRESPONDING TO AT LEAST ONE OF PLURALITY OF PHASE-DIFFERENCE DETECTION PIXELS

(71) Applicant: SK hynix Inc., Icheon-si (KR)

(72) Inventor: Min Su Cho, Icheon-si (KR)

(73) Assignee: SK HYNIX INC., Icheon-si (KR)

( * ) Notice: Subject to any disclaimer, the term of this patent is extended or adjusted under 35 U.S.C. 154(b) by 960 days.

(21) Appl. No.: 17/319,767

(22) Filed: May 13, 2021

(65) Prior Publication Data

US 2022/0102413 A1    Mar. 31, 2022

(30) Foreign Application Priority Data

Sep. 29, 2020 (KR) .................. 10-2020-0127094

(51) Int. Cl.
| | | |
|---|---|---|
| *H01L 27/146* | (2006.01) | |
| *H04N 25/11* | (2023.01) | |
| *H04N 25/704* | (2023.01) | |

(52) U.S. Cl.
CPC .. *H01L 27/14627* (2013.01); *H01L 27/14605* (2013.01); *H01L 27/14621* (2013.01);
(Continued)

(58) Field of Classification Search
CPC ......... H01L 27/14627; H01L 27/14623; H01L 27/14621; H01L 27/14605;
(Continued)

(56) References Cited

U.S. PATENT DOCUMENTS 5,618,316 A *  4/1997  Hoffman ............... A61F 2/16
427/164
6,577,344 B2 *  6/2003  Kadohara ............ G02B 7/346
348/350
(Continued)

FOREIGN PATENT DOCUMENTS

CN    104811635 A    7/2015
CN    105556672 A    5/2016
(Continued)

OTHER PUBLICATIONS

US 10,587,829 B2, 03/2020, Yokogawa et al. (withdrawn)
(Continued)

*Primary Examiner* — Michael Jung
(74) *Attorney, Agent, or Firm* — Perkins Coie LLP

(57) ABSTRACT

An image sensing device includes a pixel array including a plurality of image detection pixels structured to convert light incident onto the image detection pixels into pixel signals representing an image of an object, a plurality of phase-difference detection pixels in the pixel array structured to detect light from the object to generate a phase signal for measuring a distance between the image sensing device and the object, and a first lens positioned to direct light to the plurality of phase-difference detection pixels and including a plurality of portions each corresponding to at least one of the phase-difference detection pixels. A center of the first lens is located over a center of the plurality of phase-difference detection pixels, and each portion of the first lens extends from the center along a row or column direction between adjacent phase-difference detection pixels or along diagonal directions between the row and column directions.

14 Claims, 17 Drawing Sheets

(52) U.S. Cl.
CPC ....... *H01L 27/14623* (2013.01); *H04N 25/11* (2023.01); *H04N 25/704* (2023.01)

(58) Field of Classification Search
CPC ............ H01L 27/14645; H04N 25/704; H04N 25/134; H04N 25/11
See application file for complete search history.

(56) References Cited

U.S. PATENT DOCUMENTS

| | | | | |
|---|---|---|---|---|
| 6,606,198 | B2* | 8/2003 | Sasano | H01L 27/14685 |
| | | | | 359/619 |
| 8,780,257 | B2* | 7/2014 | Gidon | H01L 27/14621 |
| | | | | 359/626 |
| 8,790,852 | B2* | 7/2014 | Tanaka | C09D 7/41 |
| | | | | 430/7 |
| 9,185,317 | B2* | 11/2015 | Nakagawa | H04N 25/704 |
| 9,287,301 | B2* | 3/2016 | Tohyama | G01J 5/024 |
| 9,794,460 | B1* | 10/2017 | Kim | H04N 23/54 |
| 10,015,416 | B2 | 7/2018 | Borthakur et al. | |
| 10,038,018 | B2* | 7/2018 | Kim | H04N 25/702 |
| 10,347,688 | B2* | 7/2019 | Kim | H04N 23/10 |
| 10,506,187 | B2* | 12/2019 | Kim | H04N 23/80 |
| 10,623,625 | B2* | 4/2020 | Kuribayashi | G02B 7/36 |
| 10,714,539 | B2* | 7/2020 | Park | H10K 50/171 |
| 2002/0003582 | A1 | 1/2002 | Kadohara et al. | |
| 2012/0194696 | A1 | 8/2012 | Ohshitanai et al. | |
| 2013/0182156 | A1 | 7/2013 | Moriya et al. | |
| 2013/0248686 | A1 | 9/2013 | Tohyama | |
| 2017/0309662 | A1 | 10/2017 | Kim et al. | |
| 2018/0299645 | A1 | 10/2018 | Kuribayashi | |
| 2019/0281226 | A1 | 9/2019 | Wang et al. | |
| 2019/0349555 | A1* | 11/2019 | Lee | H01L 27/14627 |
| 2020/0396388 | A1* | 12/2020 | Kim | H04N 25/75 |

FOREIGN PATENT DOCUMENTS

| | | |
|---|---|---|
| CN | 107306343 A | 10/2017 |
| CN | 109309800 A | 2/2019 |
| EP | 2980852 A1 | 2/2016 |
| JP | 2011250325 A | 12/2011 |
| JP | 2018120113 A | 8/2018 |

OTHER PUBLICATIONS

Notification to Grant Patent Right for Invention for CN Appl. No. 202110515721.6, mailed on Jun. 18, 2024, 7 pages with English translation.

* cited by examiner

IMAGE SENSING DEVICE HAVING LENS WITH PLURALITY OF PORTIONS EACH CORRESPONDING TO AT LEAST ONE OF PLURALITY OF PHASE-DIFFERENCE DETECTION PIXELS

CROSS-REFERENCE TO RELATED APPLICATION

This patent document claims the priority and benefits of Korean patent application No. 10-2020-0127094, filed on Sep. 29, 2020, the disclosure of which is incorporated by reference in its entirety as part of the disclosure of this patent document.

TECHNICAL FIELD

The technology and implementations disclosed in this patent document generally relate to an image sensing device for detecting a phase difference.

BACKGROUND

An image sensing device is used in electronic devices to convert optical images into electrical signals. The recent development of automotive, medical, computer and communication industries is leading to an increase in demand for higher-performance image sensing devices in various devices such as smartphones, digital cameras, camcorders, personal communication systems (PCSs), game consoles, surveillance cameras, medical micro-cameras, robots, infrared (IR) sensing devices, etc.

Image sensing devices may be broadly classified into CCD (Charge Coupled Device) image sensing devices and CMOS (Complementary Metal Oxide Semiconductor) image sensing devices.

CMOS image sensing devices have advantages over CCD sensing devices in terms of how image sensing signals are processed. CMOS image sensing devices are fabricated using the CMOS fabrication technology, and thus CMOS image sensors and other signal processing circuitry can be integrated into a single chip, enabling the production of miniaturized, low power consumption image sensors at a lower cost.

SUMMARY

The embodiments of the disclosed technology relate to image sensing devices that can perform phase-difference detection autofocus (PDAF).

In some embodiments of the disclosed technology, image sensing devices can perform phase-difference detection autofocus (PDAF) within a high-illuminance range.

In an embodiment of the disclosed technology, an image sensing device may include a pixel array including a plurality of image detection pixels structured to convert light incident onto the image detection pixels into pixel signals representing an image of an object, a plurality of phase-difference detection pixels in the pixel array and structured to detect light from the object to generate a phase signal for measuring a distance between the image sensing device and the object, and a first lens positioned to direct light to the plurality of phase-difference detection pixels and including a plurality of portions each corresponding to at least one of the phase-difference detection pixels, wherein a center of the first lens is located over a center of the plurality of phase-difference detection pixels, and each portion of the first lens extends from the center along a row or column direction between adjacent phase-difference detection pixels or along diagonal directions between the row and column directions.

In some implementations, a width of the first lens in the row and column directions is greater than a width of the first lens in the diagonal directions.

In some implementations, each of the phase-difference detection pixels are arranged in a (2×2) matrix and corresponds to at least a portion of the first lens, wherein the row or column direction includes a first straight line passing through a center of the (2×2) matrix and overlapping with a bottom surface of the first lens, and the diagonal directions include a second straight line passing through the center of the (2×2) matrix and overlapping with the bottom surface of the first lens, and wherein a length of the first straight line is different from a length of the second straight line. In some implementations, the length of the first straight line may be shorter than the length of the second straight line.

In some implementations, the length of the first straight line is longer than the length of the second straight line.

In some implementations, the length of the second straight line is within a range from 0.95 to 0.5 times the length of the first straight line.

In some implementations, the length of the first straight line is shorter than the length of the second straight line.

In some implementations, the length of the first straight line is within a range from 0.95 to 0.5 times the length of the second straight line.

In some implementations, the phase-difference detection pixels include optical filters formed below the first lens, and wherein the optical filters include at least one of a red color filter, a green color filter and a blue color filter.

In some implementations, at least one of the optical filters formed below the first lens is different from the other optical filters formed below the first lens.

In some implementations, at least one of the optical filters formed below the first lens is the same as the other optical filters formed below the first lens.

In some implementations, the image detection pixels are arranged adjacent to the (2×2) matrix in the pixel array.

In some implementations, the image sensing device further comprising a plurality of second lenses arranged over the plurality of image detection pixels.

In some implementations, the first lens has a center thickness that is greater than a center thickness of the second lens.

In some implementations, the center thickness of the first lens is greater than the center thickness of the second lens by 100 to 300 Å.

In some implementations, each of the image detection pixels includes an optical filter formed below the second lens, and wherein the optical filter is any one of a red color filter, a green color filter and a blue color filter.

In some implementations, the optical filter further includes a light shielding structure disposed between the phase-difference detection pixel and the image detection pixel and disposed between the image detection pixels.

In some implementations, the light shielding structure includes tungsten (W).

In another embodiment of the disclosed technology, an image sensing device may include a pixel array including a plurality of phase-difference detection pixels arranged in a (2×2) matrix and structured to detect light from an object to generate a phase signal that carries information for a distance between the image sensing device and the object and a first lens located to direct light to the plurality of phase-difference detection pixels and including a plurality of portions each corresponding to at least one of the phase-difference detection pixels, wherein a center of the first lens is located over a center of the (2×2) matrix, and a bottom surface of the first lens is concavely curved toward the center of the first lens.

In some implementations, each portion of the first lens extends from the center along a row direction and a column direction between adjacent phase-difference detection pixels.

In some implementations, each portion of the first lens extends from the center along diagonal directions between row and column directions.

In another embodiment of the disclosed technology, an image sensing device may include a plurality of phase-difference detection pixels arranged in a pixel array, and configured to generate at least one phase signal, wherein each of the phase-difference detection pixels arranged in a (2×2) matrix includes at least a portion of a single first microlens. The first microlens may be configured in a manner that a length of a first straight line configured to pass through a center point of the (2×2) matrix, extend in a row or column direction of the pixel array, and overlap with a bottom surface of the first microlens, is different from a length of a second straight line configured to pass through the center point of the (2×2) matrix, extend in a direction diagonal to the row or column direction, and overlap with a bottom surface of the first microlens.

In another embodiment of the disclosed technology, an image sensing device may include a plurality of phase-difference detection pixels arranged in a pixel array in a manner that each of the phase-difference detection pixels is configured to generate a phase signal. Each of the phase-difference detection pixels arranged in a (2×2) matrix may include at least a portion of a single first microlens, and a bottom surface of the first microlens may be concavely curved toward a center point of a circle that is in contact with an inner surface of the (2×2) matrix in each of a first direction and a second direction from the circle.

It is to be understood that both the foregoing general description and the following detailed description of the disclosed technology are illustrative and explanatory and are intended to provide further explanation of the disclosure as claimed.

BRIEF DESCRIPTION OF THE DRAWINGS

The above and other features and beneficial aspects of the disclosed technology will become readily apparent with reference to the following detailed description when considered in conjunction with the accompanying drawings.

DETAILED DESCRIPTION

Figure 1:
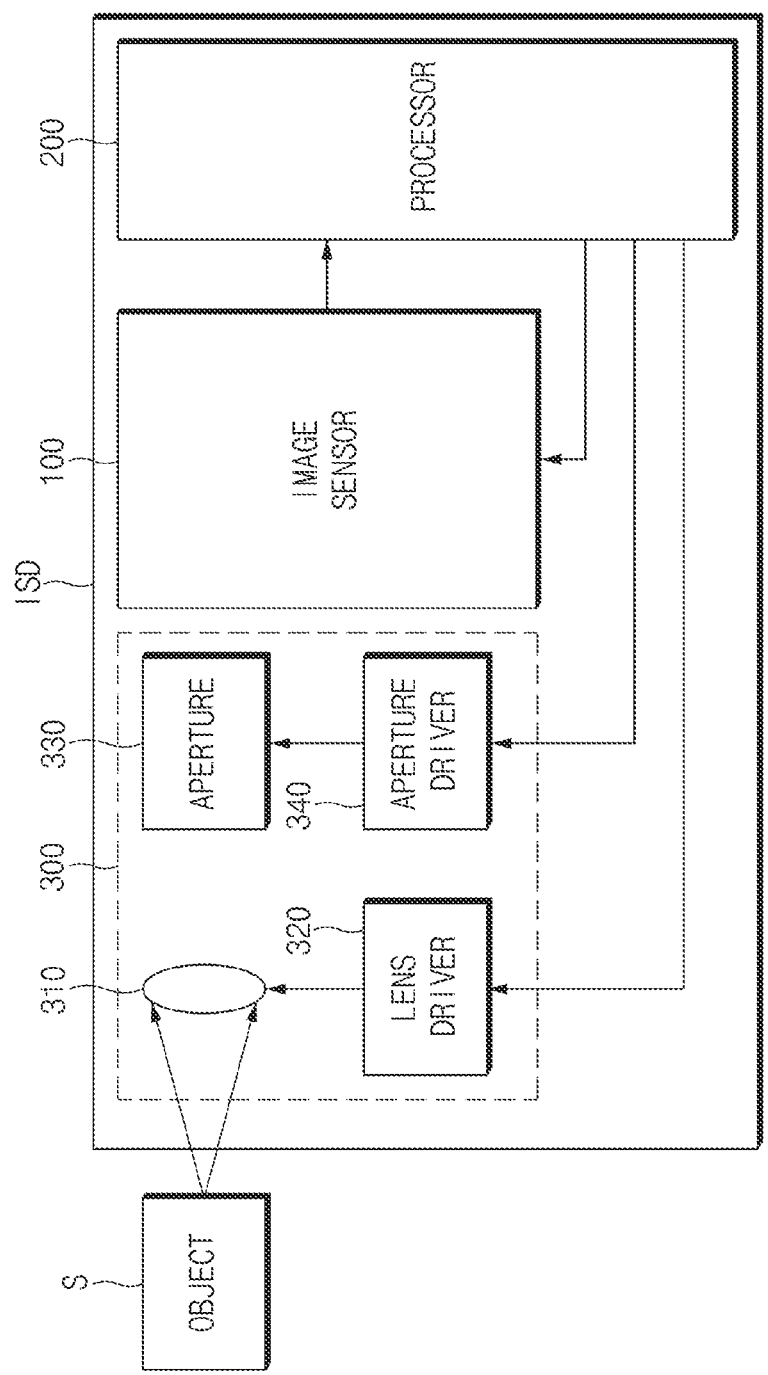
FIG. 1 is a block diagram illustrating an example of an image sensing device based on some implementations of the disclosed technology.

This patent document provides implementations and examples of an image sensing device that can perform a phase-difference detection autofocus (PDAF) to achieve one or more advantages in imaging applications.

Reference will now be made in detail to the embodiments of the disclosed technology, examples of which are illustrated in the accompanying drawings. While the disclosure is susceptible to various modifications and alternative forms, specific embodiments thereof are shown by way of example in the drawings. However, the disclosure should not be construed as being limited to the embodiments set forth herein.

Image sensing devices may perform phase-difference detection autofocus (PDAF) using phase differences between detected images. Such image sensing devices may include a pixel array in which image sensing pixels and phase-difference detection pixels are arranged in rows and columns.

FIG. 1 is a block diagram illustrating an example of an image sensing device ISD that can perform an autofocus (AF) based on some implementations of the disclosed technology.

Referring to FIG. 1, the image sensing device ISD may include an light receiving unit 300, an image sensor 100, and a processor 200.

The light receiving unit 300 may include circuitry and structures for receiving light and directing the light toward the image sensor 100. In some implementations, the light receiving unit 300 may include a lens 310, a lens driver 320, an aperture 330, and an aperture driver 340.

In one example, the lens 310 may be implemented as a single lens. In another example, the lens 310 may be implemented as a set of a plurality of lenses. In both cases, changes in the position of the lens 310 result in changes in the position of a focal point (i.e., in-focus position) with respect to an object (S) (i.e., a target object). The position of the lens 310 may be based on signals generated from pixels of the image sensor 100. In some implementations where a mobile device includes the image sensing device ISD with the lens 310, the range of an incident angle of marginal light rays with respect to an optical axis may be set to about ±10°.

In some implementations, the marginal light may indicate light rays that meet the object (S) on the optical axis and pass through the edge of the aperture 330. Thus, the phase-difference detection characteristics of the image sensing device ISD can be measured for incident light that is incident upon the lens 310 in an angle range smaller than the marginal light.

The lens driver 320 may control the position of the lens 310 based on a control signal of the processor 200. In some implementations, the lens driver 320 may adjust the distance between the lens 310 and the object (S).

The aperture 330 may be used to adjust the amount of light entering the lens 310 upon receiving a control signal from the aperture driver 340. Since the amount of light (i.e., the amount of reception light) to be incident upon the lens 310 is adjusted through the aperture 330, the magnitude of signals generated by the image sensor 100 can also be adjusted.

The aperture driver 340 may adjust the settings associated with the aperture 330 to adjust the amount of light to be incident upon the lens 310 using the adjusted settings of the aperture 330.

The processor 200 may transmit information that can be used for focus detection to the lens driver 320 based on an image signal, or may transmit a signal for adjusting settings associated with the aperture 330 to the aperture driver 340. The processor 200 may detect phase differences associated with light reflected from an object that is spaced apart from the lens 310 at a certain distance. The light is converted into electrical signals by the phase-difference detection pixels (PDPXs) to indicate the phase differences. If there is no phase difference between signals generated by phase-difference detection pixels (PDPXs) included in the image sensor 100, the object (S) may be considered as being "in-focus."

If the distance between the lens 310 and the object (S) does not satisfy the requirements for the "in-focus" position, different signals generated by different phase-difference detection pixels (PDPXs).

The processor 200 may analyze a difference between the signals generated by the phase-difference detection pixels (PDPXs) to transmit a control signal to the lens driver 320.

The lens driver 320 may move the lens 310 based on the control signal received from the processor 200 to place the object (S) at the in-focus position. In some implementations, the lens driver 320 may adjust the location of the lens 310 until the object is in focus.

The image sensor 100 may include a pixel array. Light passing through the lens 310 and the aperture 330 may be converted into electrical signals by a plurality of pixels included in the pixel array.

The pixels may be arranged in rows and columns within the pixel array.

The electrical signals generated by the pixels of the pixel array may include an image signal corresponding to an optical image of the object (S) and a phase signal that is used to measure the distance between the lens 310 and the object (S).

The image signal may be generated by the image sensor 100 by converting light rays from the object (S), and may thus be used as a signal for generating an image of the object (S).

The phase signal may be generated based on light reflected from the object (S) to the image sensor 100. In some implementations, the phase signal may be used to adjust the distance between the object (S) and the lens 310. The pixels of the pixel array may include phase-difference detection pixels (PDPXs) and image detection pixels (IPXs).

In some implementations, the phase-difference detection pixels (PDPXs) may be arranged in a (2×2) matrix. The image detection pixels (IPXs) may be arranged adjacent to the (2×2) matrix including the phase-difference detection pixels (PDPXs).

The processor 200 may acquire phase information based on output signals of the phase-difference detection pixels (PDPXs), and may acquire image information based on output signals of the image detection pixels (IPXs).

The processor 200 may control operations of the image sensing device ISD. For example, the processor 200 may provide a control signal for controlling the light receiving unit 300 based on an image signal received from the image sensor 100.

The processor 200 may receive a phase signal from the image sensor, such that the processor 200 may perform phase-difference calculation based on the received phase signal. Here, the phase signal may include output signals of the phase-difference detection pixels (PDPXs).

The processor 200 may calculate the phase difference between a pair of phase information signals acquired from two phase-difference detection pixels (PDPXs).

The processor 200 may calculate the in-focus position, the direction of a focal point, the distance between the object (S) and the image sensing device ISD, and others by performing such a phase-difference calculation.

The processor 200 may output a control signal for the lens driver 320 to adjust the location of the lens 310 based on the phase-difference calculation.

In some implementations, the processor 200 may perform image signal processing for improving an image quality, such as noise correction (or noise cancellation) of image information and an interpolation between adjacent pixels.

Figure 2:
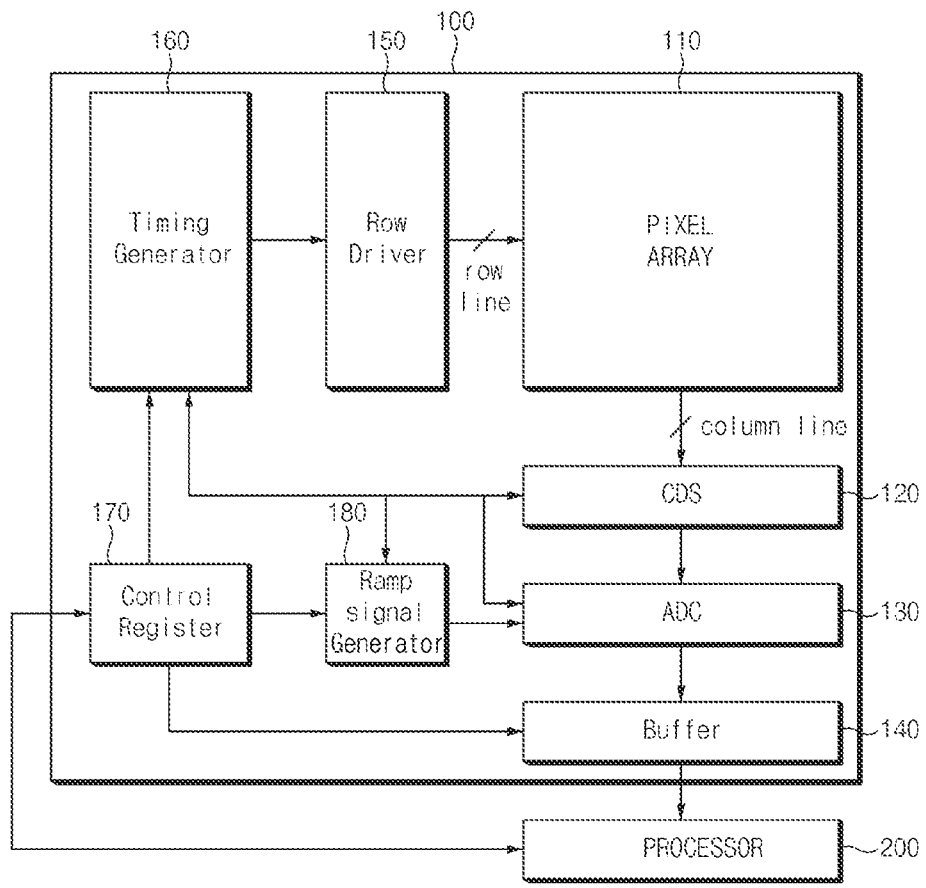
FIG. 2 is a block diagram illustrating an example of an image sensor based on some implementations of the disclosed technology.

FIG. 2 is a block diagram illustrating an example of an image sensor 100 based on some implementations of the disclosed technology.

Referring to FIG. 1, the image sensor 100 may include a pixel array 110 including a plurality of pixels arranged in a matrix array, a correlated double sampler (CDS) 120, an analog-to-digital converter (ADC) 130, a buffer 140, a row driver 150, a timing generator 160, a control register 170, and a ramp signal generator 180.

The processor 200 may receive an output signal of the buffer 140 to process the image using the received signal.

In some implementations, the pixel array 110 may include a plurality of phase-difference detection pixels (PDPXs) and a plurality of image detection pixels (IPXs). Light passing through the lens 310 and the aperture 330 may enter the pixel array 110 and is converted into electrical signals.

The image detection pixels (IPXs) and the phase-difference detection pixels (PDPXs) included in the pixel array 110 may convert light into electrical charges to output electrical signals corresponding to the light to the correlated double sampler (CDS) 120.

The image detection pixels (IPXs) may generate signals corresponding to the object (S) shown in FIG. 1. The phase-difference detection pixels (PDPXs) may capture an image of the object (S) to generate phase signals using the captured image. The phase signals may be transferred to the processor 200 and may be used to detect the distance between the object (S) and the lens 310.

In some implementations, the pixel array 110 may include a (2×2) matrix that includes four phase-difference detection pixels (PDPXs).

The image sensing device ISD may detect a phase difference using phase signals generated by two phase-difference detection pixels (PDPXs).

The phase signals may include information about where the two phase-difference detection pixels (PDPXs) are located in the pixel array 110.

The processor 200 may calculate a phase difference between two phase information signals obtained from the two phase-difference detection pixels (PDPXs) to calculate the in-focus position of the lens 310. In some implementations, the phase difference may be used to place the lens 310 at a specific position at which the two phase information signals detected by the two phase-difference detection pixels (PDPXs) have no phase difference.

The image detection pixels (IPXs) may be used to generate the image signal of the object (S).

The correlated double sampler (CDS) 120 may sample and hold electrical signals received from the pixel array 110. The correlated double sampler (CDS) 120 may perform double sampling on a voltage level of an image signal converted from incident light by an image sensing pixel and a noise level associated with the image sensing pixel, and may output a signal level corresponding to a difference between the voltage level of the image signal and the noise level.

The analog-to-digital converter (ADC) 130 may convert analog signals into digital signals, and may provide the digital signals to the buffer 140.

The buffer 140 may hold or latch the digital signals to sequentially output the digital signals to the processor 200. The buffer 140 may include a memory circuit for holding the digital signals and a sense amplifier for amplifying the digital signals.

The row driver 150 may be used to activate the plurality of pixels contained in the pixel array 110 in response to an output signal of the timing generator 160. For example, the row driver 150 may generate a selection signal to select any one of the row lines.

In some implementations, the row driver 150 may generate control signals such as a transfer-transistor drive signal, a reset-transistor drive signal, and a selection-transistor drive signal to operate transistors in the pixels.

The row driver 150 may generate selection signals or drive signals for the plurality of phase-difference detection pixels (PDPXs) when the autofocus function is performed.

The timing generator 160 may control the row driver 150 to operate the pixel array 110. The pixel array 110 can convert light into electrical charges, temporarily store the electrical charges, and output electrical signals corresponding to the electrical charges.

The timing generator 160 may control the correlated double sampler (CDS) 120 to sample and hold electrical signals received from the pixel array 110.

The control register 170 may generate control signals to control the buffer 140, the timing generator 160, and the ramp signal generator 180 based on the control signals received from the processor 200.

The ramp signal generator 180 may generate a ramp signal that enables the analog-to-digital converter (ADC) to detect a signal in response to a control signal received from the timing generator 160.

The processor 200 may receive an output signal of the buffer 140 as an input, may calculate phase information or image information based on the received signal, and may generate a signal based on the calculated phase or image information. As described above, the processor 200 may control the aperture driver 340 based on the image signal. In addition, the processor 200 may control the lens driver 320 based on the phase signal.

The control register 170 may generate the control signals for the aperture driver 340 and the lens driver 320 based on the signal received from the processor 200.

Figure 3:
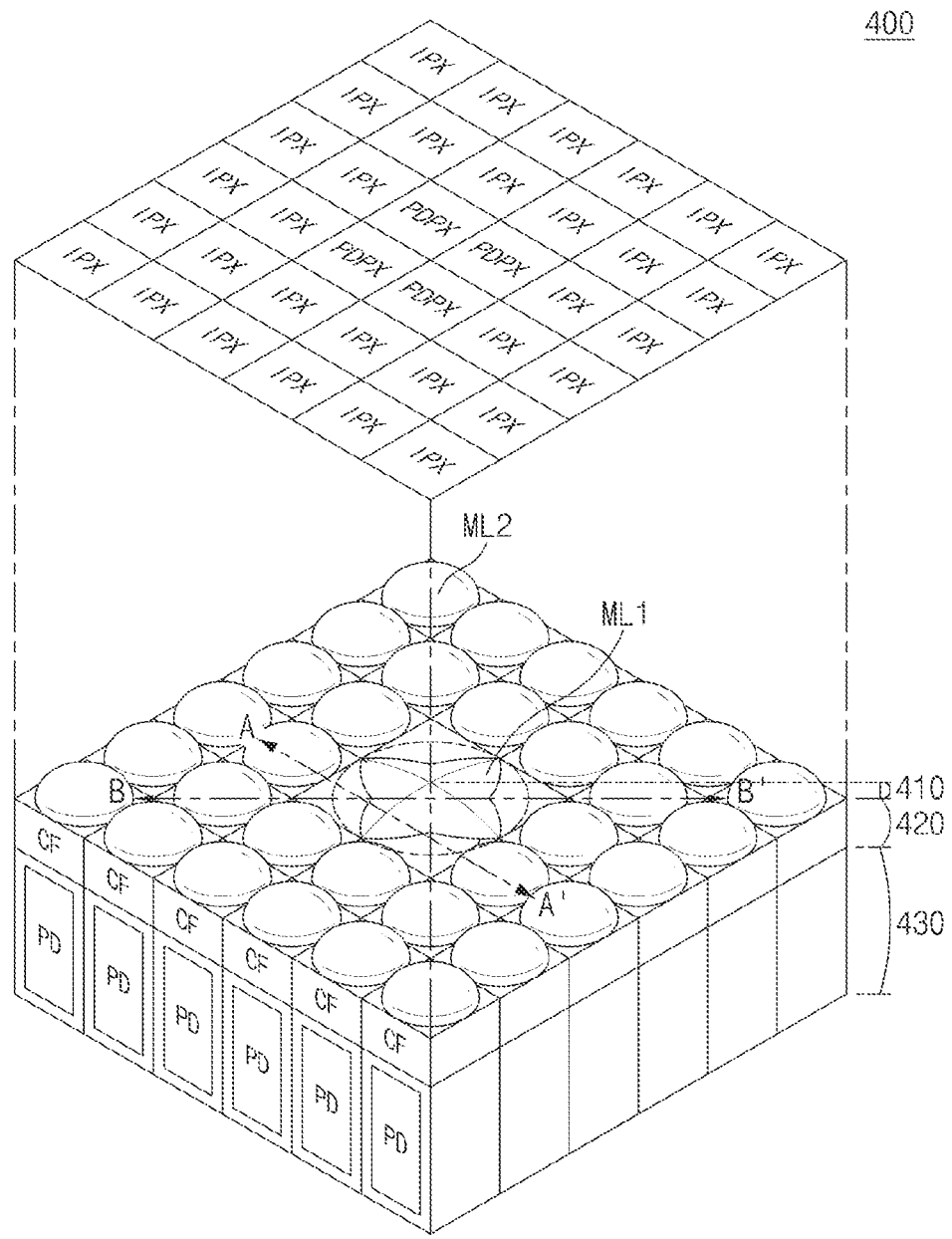
FIG. 3 is a perspective view illustrating an example of a pixel array based on some implementations of the disclosed technology.

FIG. 3 is a perspective view illustrating an example of a pixel array 400 based on some implementations of the disclosed technology.

Referring to FIG. 3, the pixel array 400 may include a plurality of phase-difference detection pixels (PDPXs) and a plurality of image detection pixels (IPXs). The phase-difference detection pixels (PDPXs) and the image detection pixels (IPXs) may be arranged in a matrix array.

The pixel array 400 may include an array of lenses 410 such as a microlens array, an optical filter array 420, and a photoelectric conversion element array 430, and a wiring layer (not shown). In some implementations of the disclosed technology, the microlens array 410 may include a first microlens ML1 and a plurality of second microlenses ML2. The first microlens ML1 can be shared by two or more phase-difference detection pixels (PDPXs) arranged in the 2×2 matrix array and is used to direct light to the PDPXs. The optical filter array 420 may include a plurality of optical filters (CFs), and the photoelectric conversion element array 430 may include a plurality of photoelectric conversion elements (PDs).

In one example, each phase-difference detection pixel (PDPX) contained in the (2×2) matrix may include at least a portion of the first microlens ML1. In other words, the phase-difference detection pixels (PDPXs) contained in the (2×2) matrix may share the first microlens ML1.

Each image detection pixel (IPX) may include one second microlens ML2. That is, the image detection pixels (IPXs) may include the second microlenses (ML2s), respectively. Each of the phase-difference detection pixels (PDPXs) and each of the image detection pixels (IPXs) may include the optical filter (CF) and the photoelectric conversion element (PD).

The microlens array 410 may overlap with the optical filter array 420. Thus, in each phase-difference detection pixel (PDPX), the optical filter (CF) may be formed below the first microlens ML1. In each image detection pixel (IPX), the optical filter (CF) may be disposed below the second microlens ML2.

The microlens array 410 may adjust or control a path of light incident upon the image sensor 100.

The first microlens ML1 shared by the phase-difference detection pixels (PDPXs) may be formed to have a center thickness that is greater than that of the second microlens ML2. Thus, the amount of light collected by the first microlens ML1 may be greater than the amount of light collected by the second microlens ML2.

If the amount of light collected by the first microlens ML1 is greater than the amount of light collected by the second microlens ML2, the photoelectric conversion elements (PDs) of the phase-difference detection pixels (PDPXs) are saturated first, and the phase signal generated by the saturated the photoelectric conversion elements (PDs) may render the distance between the lens 310 and the object (S) that is computed based on the phase signal inaccurate, resulting in a decrease in the accuracy of the autofocus (AF) function.

If the autofocus (AF) function is not performed in a situation in which the image signal is detected, the quality of the captured images may decrease.

In some implementations of the disclosed technology, the first microlens ML1, which is different from the second microlens ML2, is arranged over the photoelectric conversion elements (PDs) of the phase-difference detection pixels (PDPXs) to adjust the sensitivity of the phase-difference detection pixels (PDPXs). In one example, the shape of the first microlens ML1 overlapped with upper portions of the phase-difference detection pixels (PDPXs) may be structured in a way that adjusts the sensitivity of the respective phase-difference detection pixels (PDPXs).

In some implementations, the first microlens ML1 includes a center and four portions that extends from the center in row and column axes in the 2×2 matrix array of the four phase-difference detection pixels (PDPXs). The center of the first microlens ML1 is located over a center of the 2×2 matrix array of the four phase-difference detection pixels (PDPXs) and is thicker than other portions of the first microlens ML1. In one example, each of the four portions extending in the row and column axes tapers toward one end with the other end connected to the center. In some implementations, the width of the first microlens ML1 in the row and column directions of the pixel array 400 may be larger than the width of the first microlens ML1 in a diagonal direction of the pixel array 400.

Since the first microlens ML1 has a larger width in the row and column directions of the pixel array 400, the sensitivity of the phase-difference detection pixels (PDPXs) can be adjusted and the phase-difference detection capability can be improved.

The second microlens ML2 may be a spherical lens. Here, the second microlens ML2 implemented as the spherical lens may have a constant diameter or width in each of the row direction, the column direction, and the diagonal directions of the pixel array 400.

The optical filter array 420 may include a plurality of optical filters (CFs) that can filter incident light at specific wavelengths.

The photoelectric conversion element array 430 may include a plurality of photoelectric conversion elements (PDs). The photoelectric conversion elements (PDs) may be arranged to correspond to pixels PDPXs or IPXs, respectively. That is, the photoelectric conversion elements (PDs) may be in one-to-one correspondence with the phase-difference detection pixels (PDPXs), or in one-to-one correspondence with the image detection pixels (IPXs).

The photoelectric conversion elements (PD) may generate photocharges corresponding to incident light that has penetrated the microlens array 410 and the optical filter array 420.

Each of the photoelectric conversion elements (PDs) may be implemented as a photodiode, a phototransistor, a photogate, a pinned photodiode (PPD), or a combination thereof. For convenience of description, it is assumed that each photoelectric conversion element (PD) is implemented as a photodiode as an example.

If the photoelectric conversion element (PD) is a photodiode, the photoelectric conversion element (PD) may include a stacked structure in which an N-type impurity region and a P-type impurity region are vertically stacked.

The wiring layer (not shown) may be disposed below each photoelectric conversion element (PD). Here, the wiring layer may also be called a line layer as needed.

The wiring layer (not shown) may include a reset transistor, a transfer transistor, a floating diffusion (FD) region, a drive transistor, a selection transistor, etc.

The reset transistor may be activated in response to the reset signal, such that the reset transistor may reset each of the potential of each phase-difference detection pixel (PDPX) and the potential of each image detection pixel (IPX) to a predetermined voltage level (e.g., a pixel voltage level).

In addition, as soon as the reset transistor is activated, the transfer transistor may be activated to reset the floating diffusion (FD) region.

Since the transfer transistor is activated in response to a transmission (Tx) signal, the transfer transistor can provide photocharges accumulated in the photoelectric conversion element (PD) of each pixel to the floating diffusion (FD) region.

The drive transistor may receive a pixel voltage through a drain terminal thereof, and may be coupled to a floating diffusion (FD) region through a gate terminal thereof. In addition, the drive transistor may be coupled to the selection transistor through a source terminal thereof.

The drive transistor may output a current corresponding to the potential of the floating diffusion (FD) region coupled to a gate electrode to a signal line through the selection transistor.

The selection transistor may be activated in response to a selection signal applied to a gate electrode thereof, such that the selection transistor may transmit an output signal of the drive transistor to a signal line.

Each signal that is output from the wiring layer (not shown) to the signal line may be converted into the image signal or the phase signal through noise cancellation and analog-to-digital conversion (ADC) processing.

In other words, the signals generated by the photoelectric conversion elements (PD) can be transferred to the processor 200 (see FIG. 2) through the wiring layer (not shown). The processor 200 shown in FIG. 2 may receive phase signals to calculate a phase difference between the phase signals.

Figure 4:
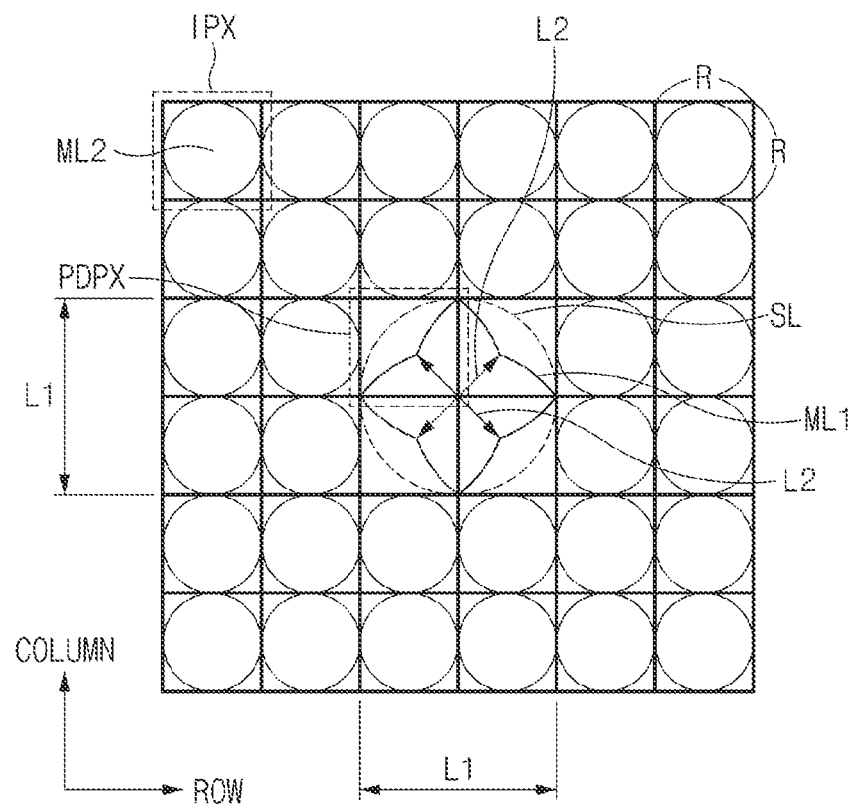
FIG. 4 is a top view illustrating an example of a pixel array based on some implementations of the disclosed technology.

FIG. 4 is a top view illustrating an example of the pixel array 400 based on some implementations of the disclosed technology.

Referring to FIG. 4, each pixel PDPX or IPX of the pixel array 400 is illustrated as a square shape with vertical/horizontal side length of R, however the pixel PDPX or IPX of the pixel array 400 may have any other shape.

In some implementations, the vertical side length and the horizontal side length of each image detection pixel IPX may be different from those of each phase-difference detection pixel PDPX. In some implementations, each pixel IPX or PDPX may be formed in a diamond shape, a hexagonal shape, or any other shape.

In some implementations, the microlens is implemented as a spherical microlens that has a round bottom surface of a radius R and overlaps with the phase-difference detection pixels (PDPXs) constructing the (2×2) matrix. In FIG. 4, the round bottom surface of the spherical microlens is denoted by "SL."

The phase-difference detection pixels (PDPXs) may be arranged in the (2×2) matrix. The processor 200 may select two phase-difference detection pixels (PDPXs) from among the phase-difference detection pixels (PDPXs) included in the (2×2) matrix array. The processor 200 may compute a phase difference using phase signals received from the selected phase-difference detection pixels (PDPXs).

Since the phase-difference detection pixels (PDPXs) are arranged in the (2×2) matrix array, the image sensing device ISD may calculate a vertical phase difference, a horizontal phase difference, or a diagonal phase difference using phase signals generated by the phase-difference detection pixels (PDPXs) sharing only one first microlens ML1.

The phase-difference detection pixels (PDPXs) arranged in the (2×2) matrix may be disposed at any positions of the pixel array 400. The positions of such phase-difference detection pixels (PDPXs) arranged in the pixel array 400 may be determined experimentally.

The first microlens ML1 may be symmetric about a boundary line between the phase-difference detection pixels (PDPXs) that are adjacent in the vertical direction of the (2×2) matrix.

In addition, the first microlens ML1 may be symmetric about a boundary line between the phase-difference detection pixels (PDPXs) that are adjacent in the horizontal direction of the (2×2) matrix. In some implementations, the first microlens ML1 includes four portions each corresponding to one of the four phase-difference detection pixels (PDPXs).

In FIG. 4, the row or horizontal axis or the column or vertical axis of the (2×2) matrix that passes through the center of the (2×2) matrix and overlaps with the bottom surface of the first microlens ML1 is referred to as "first straight line L1." The length of the first straight line L1 would be 2R.

In addition, the diagonal width of the first microlens ML1 is indicated by "second straight line L2," which passes through the center of the (2×2) matrix. The length of the second straight line L2 may be shorter than 2R.

In some implementations, the length of the second straight line L2 may be within a range from 0.95 to 0.5 times the length of the first straight line L1. Since the second straight line L2 is shorter than the first straight line L1, the amount of incident light that enters the phase-difference detection pixels (PDPXs) through the first microlens ML1 would be reduced.

The bottom surface of each second microlens ML2 may have a circular shape with a radius of R/2. Each second microlens ML2 may converge the incident light to the corresponding image detection pixel (IPX).

Since the second straight line L2 is shorter than the first straight line L1, the size of a portion of the first microlens ML1 that is used by one phase-difference detection pixel (PDPX) may be smaller than the bottom surface of the second microlens ML2 that is used by one image detection pixel (IPX).

In other words, since the second straight line L2 is shorter than the first straight line L1, the bottom surface of the first microlens ML1 is concavely curved toward the center of the (2×2) matrix in the direction of the second straight line L2 (i.e., in the direction diagonal to the row and column directions of the pixel array 400).

Referring to FIG. 4, since the first microlens ML1 is concavely curved in the direction diagonal to the row and column directions of the pixel array 400 unlike the spherical microlens SL, the area of a portion of the bottom surface of the first microlens ML1 that is used by each phase-difference detection pixel (PDPX) may be smaller than $$\frac{R^2}{4} * \pi.$$

In contrast, the area of the bottom surface of the second microlens ML2 that is used by each image detection pixel (IPX) may would be $$\frac{R^2}{4} * \pi.$$

Figure 5A:
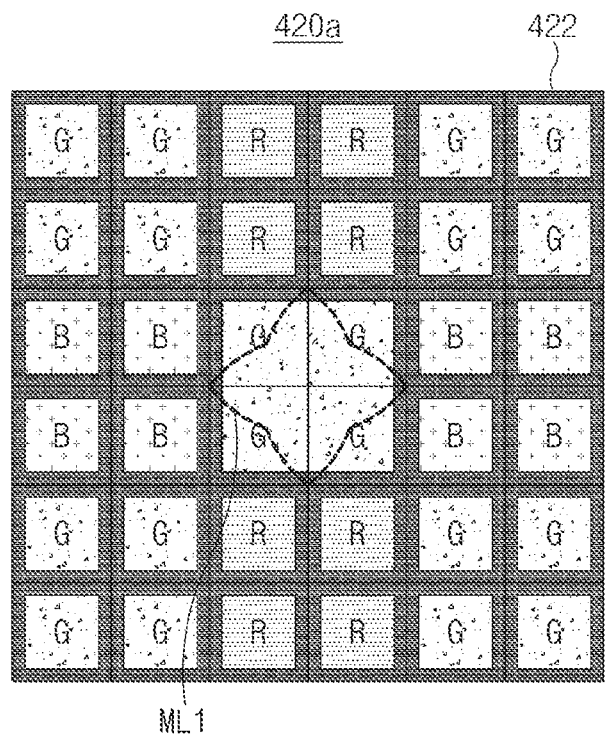
FIG. 5A is a schematic diagram illustrating an example of a first optical filter array based on some implementations of the disclosed technology.
Figure 5B:
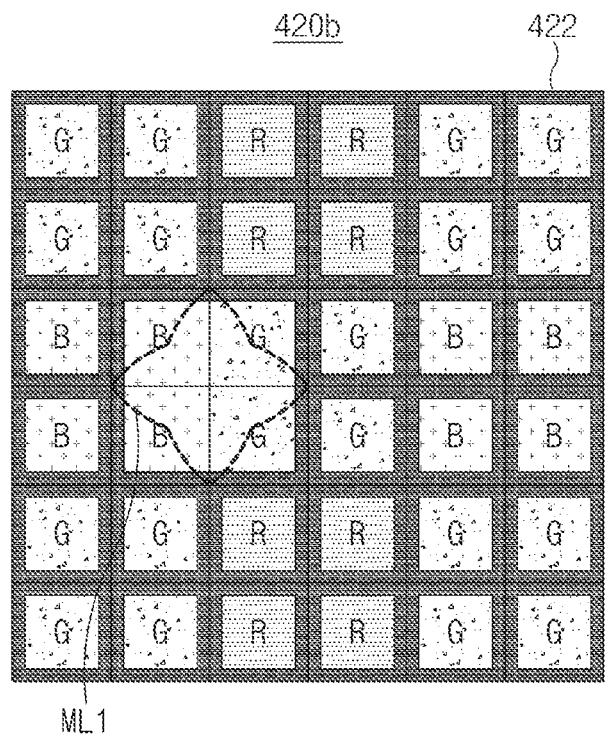
FIG. 5B is a schematic diagram illustrating an example of a second optical filter array based on some implementations of the disclosed technology.
Figure 5C:
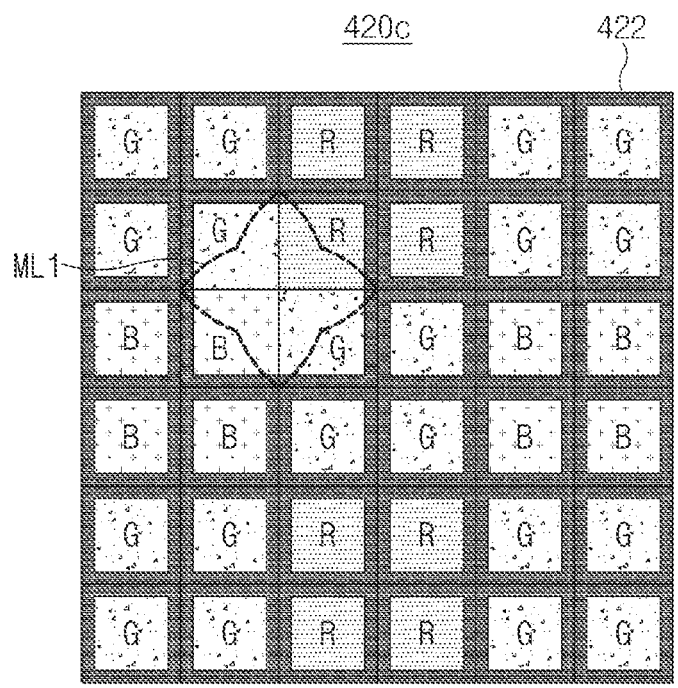
FIG. 5C is a schematic diagram illustrating an example of a third optical filter array based on some implementations of the disclosed technology.

FIG. 5A is a schematic diagram illustrating an example of a first optical filter array 420a based on some implementations of the disclosed technology. FIG. 5B is a schematic diagram illustrating an example of a second optical filter array 420b based on some implementations of the disclosed technology. FIG. 5C is a schematic diagram illustrating an example of a third optical filter array 420c based on some other implementations of the disclosed technology.

In FIG. 5A, dotted lines indicate the bottom surface of the first microlens ML1 where the first microlens ML1 overlaps with the first optical filter array 420a, which include the optical filters (Rs, Gs, Bs). In FIG. 5B, dotted lines indicate the bottom surface of the first microlens ML1 where the first microlens ML1 overlaps with the second optical filter array 420b. In FIG. 5C, dotted lines indicate the bottom surface of the first microlens ML1 where the first microlens ML1 overlaps with the third optical filter array 420c.

In some implementations, the optical filters (Rs, Gs, Bs) included in each of the first to third optical filter arrays 420a, 420b, and 420c can include a first optical filter (R), a second optical filter (G), and a third optical filter (B). The first optical filter (R) allows light at red wavelengths to pass through. The second optical filter (G) allows light at green wavelengths to pass through. The third optical filter (B) allows light at blue wavelengths to pass through.

The first to third optical filters (R, G, B) included in each of the first to third optical filter arrays 420a, 420b, and 420c may be arranged in a quad Bayer pattern.

In some implementations, the quad Bayer pattern may include the first optical filters (Rs) that construct the (2×2) matrix, the second optical filters (Gs) that construct the (2×2) matrix, and the third optical filters (Bs) that construct the (2×2) matrix. The 2×2 matrices composed of the respective optical filters can construct the Bayer pattern.

The Bayer pattern may indicate that one first optical filter (R), two second optical filters (Gs), and one third optical filter (B) are arranged in a matrix, and two second optical filters (Gs) are arranged in a diagonal direction. In other words, the quad Bayer pattern may refer to an extension of the Bayer pattern.

As illustrated in FIG. 5A, in some implementations, the phase-difference detection pixels (PDPXs) are arranged in a (2×2) matrix and the phase-difference detection pixels (PDPXs) of the (2×2) matrix correspond to the second optical filters (Gs).

If the phase-difference detection pixels (PDPXs) that share the first microlens ML1 in the (2×2) matrix include optical filters of the same type, the first microlens ML1 may be symmetric in shape about the row and column axes in the first optical filter array 420a.

The refractive indices of incident light may vary depending on wavelengths of the incident light. Therefore, in some implementations, the variation of the shape of the first microlens ML1 may depend on the categories of the optical filters disposed below the first microlens ML1.

The refractive index of a material depends on the optical frequency or wavelength, and typically the refractive index decreases for longer wavelengths. Thus, the disclosed technology can be used in some implementations to vary the shape of the first microlens ML1 based on the wavelength corresponding to the optical filter disposed below the first microlens ML1.

As illustrated in FIG. 5B, in some implementations, the phase-difference detection pixels (PDPXs) are arranged in a (2×2) matrix including two second optical filters (Gs) and two third optical filters (Bs). The phase-difference detection pixels (PDPXs) of the (2×2) matrix share the first microlens ML1.

Since the incident light having penetrated the second optical filter (G) has a longer wavelength than the other incident light having penetrated the third optical filter (B), the incident light having penetrated the second optical filter (G) may be less refracted than the other incident light having penetrated the third optical filter (B). Therefore, if the first microlens ML1 shown in FIG. 5B is horizontally symmetric in shape, signal distortion may occur in the phase signal.

In the first microlens ML1 shown in FIG. 5B, a region formed to overlap with an upper portion of the second optical filter (G) may be formed to have a higher refractive index than the other region formed to overlap with an upper portion of the third optical filter (B).

As illustrated in FIG. 5C, in some implementations, the phase-difference detection pixels (PDPXs) are arranged in the (2×2) matrix including one first optical filter (R), two second optical filters (Gs) and one third optical filter (B). The phase-difference detection pixels (PDPXs) of the (2×2) matrix share the first microlens ML1.

Since the incident light having penetrated the first optical filter (R) has a longer wavelength than the other incident light having penetrated the second optical filter (G) or the third optical filter (B), the incident light having penetrated the first optical filter (R) may be less refracted than the other incident light having penetrated the second optical filter (G) or the third optical filter (B). Therefore, if the first microlens ML1 shown in FIG. 5C is horizontally symmetric in shape, signal distortion may occur in the phase signal.

In the first microlens ML1 shown in FIG. 5C, the region formed to overlap with an upper portion of the first optical filter (R) may have a maximum refractive index, and the region formed to overlap with an upper portion of the third optical filter (B) may have a minimum refractive index.

As illustrated in FIGS. 5B and 5C, the optical filters formed below the first microlens ML1 may include some optical filters configured to pass the incident light having the same wavelength, or may include some optical filters configured to pass the incident light having different wavelengths. However, the optical filters included in the phase-difference detection pixels (PDPXs) arranged in the (2×2) matrix need not always be used as the optical filters configured to pass the same light.

In addition, each of the first optical filter array 420a, the second optical filter array 420b, and the third optical filter array 420c may include a light shielding structure 422. The light shielding structure 422 may prevent optical crosstalk between the adjacent phase-difference detection pixels (PDPXs) and image detection pixels (IPXs), or may prevent optical crosstalk between the adjacent image detection pixels (IPXs). Here, the crosstalk may refer to a situation in which the incident light affects signals of the adjacent pixels.

If the light shielding structure 422 is disposed between the phase-difference detection pixels (PDPXs), the light shielding structure 422 may reflect the incident light, such that detection of the phase signal for the incident light that is incident in the vicinity of a boundary between the phase-difference detection pixels (PDPXs) can be interrupted or prevented.

Therefore, the light shielding structure 422 may be disposed between the phase-difference detection pixels (PDPXs) and the image detection pixels (IPXs), or may be disposed between the image detection pixels (IPXs).

Since the light shielding structure 422 is not disposed between the phase-difference detection pixels (PDPXs), reflection of the incident light caused by the light shielding structure 422 may be prevented.

In a situation in which the light shielding structure 422 is not disposed between the phase-difference detection pixels (PDPXs), whereas the phase signal for the incident light that is incident in the vicinity of the boundary line between the phase-difference detection pixels (PDPXs) can be easily detected, the phase-difference detection pixels (PDPXs) may have higher sensitivity.

If the sensitivity of the phase-difference detection pixels (PDPXs) excessively increases, the phase-difference detection pixels (PDPXs) may be saturated earlier than the image detection pixels (IPXs) as described above, such that it may be impossible to perform a phase-difference detection function. In order to address the above-mentioned issues, the shape of the first microlens ML1 may be adjusted or changed.

The light shielding structure 422 may include, for example, tungsten (W).

Figure 6A:
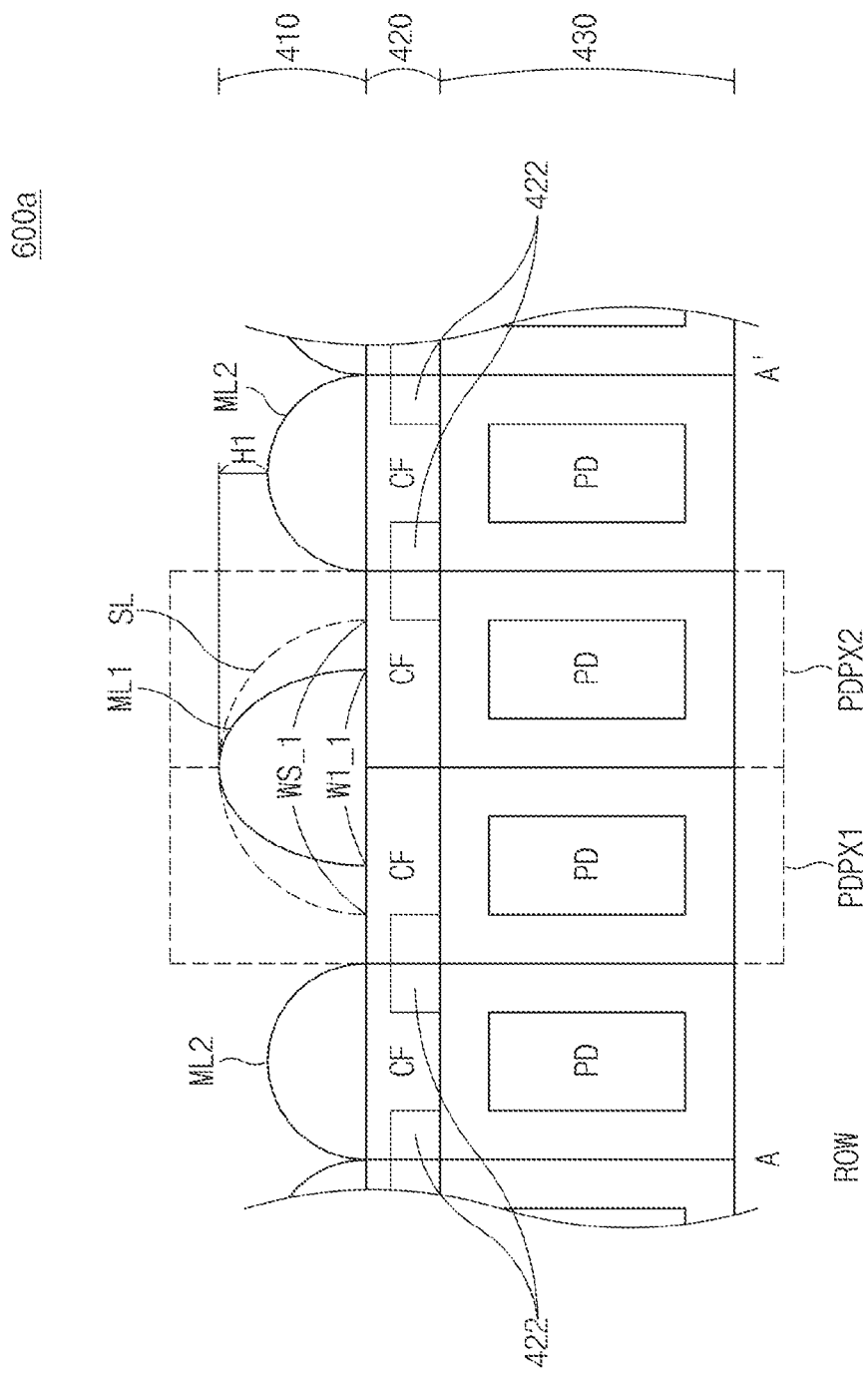
FIG. 6A is a cross-sectional view illustrating an example of a pixel array taken along a first cutting line A-A' shown in FIG. 3 based on some implementations of the disclosed technology.
Figure 6B:
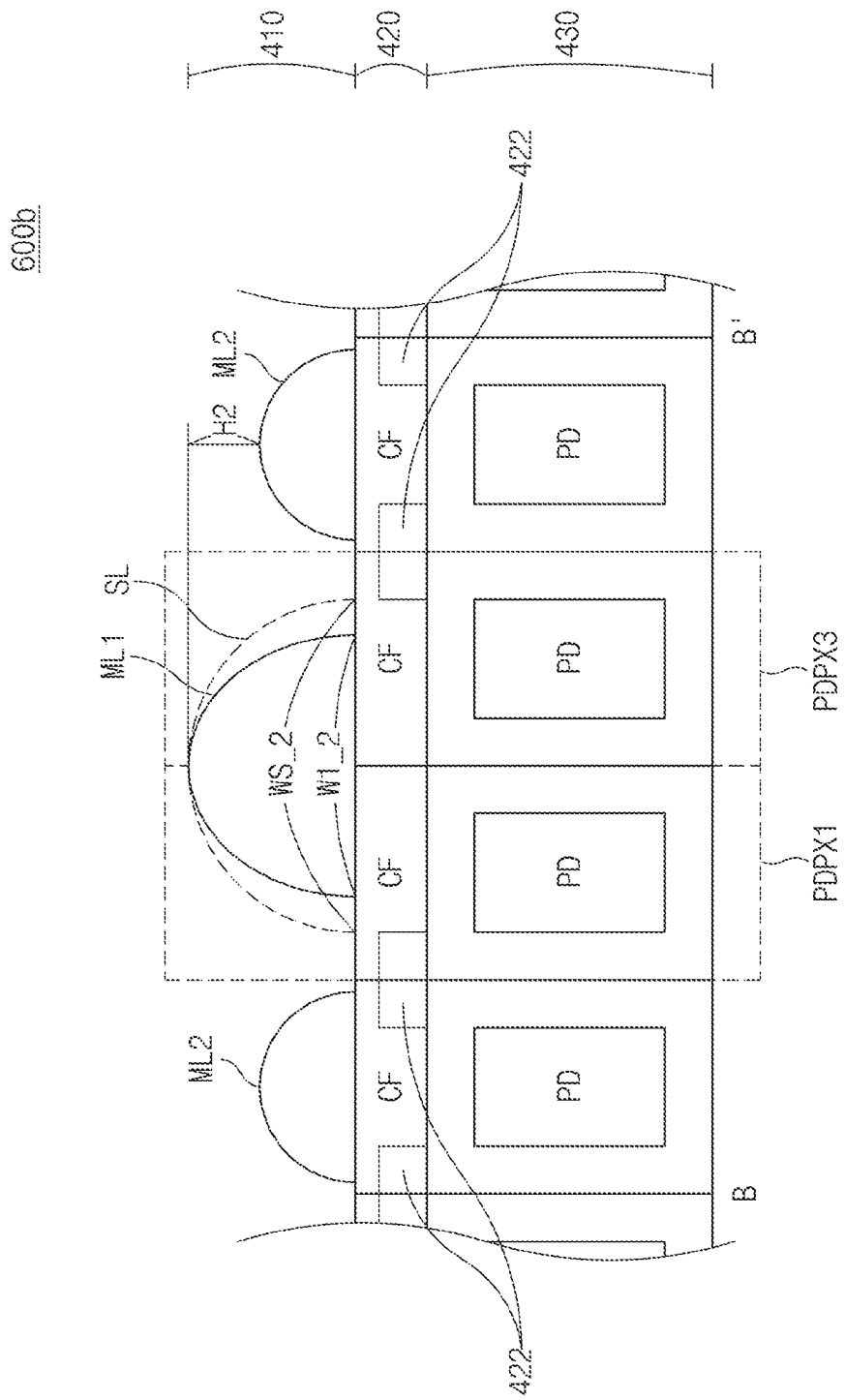
FIG. 6B is a cross-sectional view illustrating an example of a pixel array taken along a second cutting line B-B' shown in FIG. 3 based on some implementations of the disclosed technology.

FIG. 6A is a cross-sectional view 600a illustrating an example of the pixel array 400 taken along the first cutting line A-A' shown in FIG. 3 based on some implementations of the disclosed technology, and FIG. 6B is a cross-sectional view 600b illustrating an example of the pixel array 400 taken along the second cutting line B-B' shown in FIG. 3 based on some implementations of the disclosed technology.

FIG. 6A is the cross-sectional view 600a illustrating the pixel array 400 taken along the first cutting line A-A'. In this case, the first cutting line A-A' may be a straight line extending in the row direction of the pixel array 400.

For convenience of description, it is assumed that a spherical microlens SL is used as the first microlens ML1. Here, the spherical microlens SL may have a radius R of a bottom surface thereof, may have the same height as the first microlens ML1, and may overlap with the phase-difference detection pixels (PDPXs) constructing the (2×2) matrix. In order to describe a detailed shape of the first microlens ML1, a cross-sectional view illustrating the spherical microlens SL taken along the first cutting line A-A' and a cross-sectional view illustrating the first microlens ML1 taken along the first cutting line A-A' are shown in FIG. 6A.

When viewed in the cross-sectional direction of the pixel array taken along the first cutting line A-A', the first microlens ML1 may be formed to have a higher height than the second microlens ML2 by a predetermined height H1. For example, H1 may be set to 100 to 300 Å.

A row-directional width W1_1 of the first microlens ML1 may be smaller than a row-directional width WS_1 of the spherical microlens SL.

In FIG. 6A, from among the phase-difference detection pixels (PDPXs) PDPX1 and PDPX2 sharing the first microlens ML1, the phase-difference detection pixel (PDPX)

located at the left side may hereinafter be referred to as a first phase-difference detection pixel (PDPX1), and the phase-difference detection pixel (PDPX) located at the right side may hereinafter be referred to as a second phase-difference detection pixel (PDPX2).

It may be possible to perform phase-difference detection autofocusing using the phase signal detected by the first phase-difference detection pixel (PDPX1) and the phase signal detected by the second phase-difference detection pixel (PDPX2).

In response to the incident light that has an arbitrary angle of incidence with respect to the optical axis of the first microlens ML1, the signal detected by either the first phase-difference detection pixel (PDPX1) or the second phase-difference detection pixel (PDPX2) may be referred to as the phase signal.

As a phase difference between the phase signal of the first phase-difference detection pixel (PDPX1) and the phase signal of the second phase-difference detection pixel (PDPX2) in response to the incident light that has an arbitrary angle of incidence with respect to the optical axis of the first microlens ML1 increases, the processor 200 can more easily calculate the in-focus position.

In order to easily represent a phase difference between the phase signal (i.e., first phase signal) detected by the first phase-difference detection pixel (PDPX1) and the other phase signal (i.e., second phase signal) detected by the second phase-difference detection pixel (PDPX2), a first value obtained when the first phase signal detected by the first phase-difference detection pixel (PDPX1) is divided by the second phase signal detected by the second phase-difference detection pixel (PDPX2) or a second value obtained when the second phase signal detected by the second phase-difference detection pixel (PDPX2) is divided by the first phase signal detected by the first phase-difference detection pixel (PDPX1) may be used.

For convenience of description and better understanding of the disclosed technology, the first value obtained when the first phase signal detected by the first phase-difference detection pixel (PDPX1) is divided by the second phase signal detected by the second phase-difference detection pixel (PDPX2) will hereinafter be referred to as a left/right (L/R) ratio, and the second value obtained when the second phase signal detected by the second phase-difference detection pixel (PDPX2) is divided by the first phase signal detected by the first phase-difference detection pixel (PDPX1) will hereinafter be referred to as a right/left (R/L) ratio.

If the angle of incidence is set to 0°, the first phase signal detected by the first phase-difference detection pixel (PDPX1) may be identical in level to the second phase signal detected by the second phase-difference detection pixel (PDPX2). Here, each of the L/R ratio and the R/L ratio may be set to "1".

In the case of using the incident light having the same angle of incidence, the L/R ratio (or R/L ratio) obtained when the microlens has a high curvature may be higher than the other L/R ratio (or R/L ratio) obtained when the microlens has a low curvature.

In this case, the curvature may refer to the bending degree of a curve, and may approximate to the inverse of the radius of curvature of a spherical surface that is in contact with the curve. The relationship between the curvature and the L/R ratio (or R/L ratio) of the first microlens ML1 will hereinafter be described with reference to FIGS. 8A, 8B, and 8C.

When viewed in the direction of the first cutting line A-A', the row-directional width W1_1 of the first microlens ML1 is smaller than the row-directional width WS_1 of the spherical microlens SL, such that the curvature of the first microlens ML1 may be greater than the curvature of the spherical microlens SL. Therefore, phase-difference detection characteristics of the image sensing device ISD can be greatly improved by the first microlens ML1.

The first cutting line A-A' may be a cutting line extending in the row direction of the pixel array 400. However, although the pixel array 400 is taken along the other cutting line, which is spaced apart from the center point of the first microlens ML1 by the same distance as the first cutting line A-A' and extends in the column direction of the pixel array 400, the cross-sectional view of the pixel array 400 taken along the other cutting line may be substantially identical to the cross-sectional view of FIG. 6A.

FIG. 6B illustrates the cross-sectional view 600b of the pixel array 400 taken along the second cutting line B-B' shown in FIG. 3. The second cutting line B-B' may be a straight line extending in the direction diagonal to the row and column directions of the pixel array 400. Here, the second cutting line B-B' may pass through the center point of the phase-difference detection pixel (PDPX).

For convenience of description, it is assumed that the spherical microlens SL is used as the first microlens ML1. Here, the spherical microlens SL may have the radius R of a bottom surface thereof, may have the same height as the first microlens ML1, and may overlap with the phase-difference detection pixels (PDPXs) constructing the (2×2) matrix. In order to describe a detailed shape of the first microlens ML1, a cross-sectional view illustrating the spherical microlens SL taken along the second cutting line B-B' and a cross-sectional view illustrating the first microlens ML1 taken along the second cutting line B-B' are shown in FIG. 6B.

The diagonal width W1_2 of the first microlens ML1 may be smaller than the diagonal width WS_2 of the spherical microlens SL. In addition, the diagonal width W1_2 of the first microlens Ml1 may be identical to the length of the second straight line L2 shown in FIG. 4, and the diagonal width WS_2 of the spherical microlens SL may be identical to the length of the first straight line L1 shown in FIG. 4.

Since the second straight line L2 is shorter in length than the first straight line L1, the curvature of the first microlens ML1 may be greater than the curvature of the spherical microlens SL.

In some implementations, FIG. 6B is the cross-sectional view 600b of the pixel array 400 taken along the second cutting line B-B', such that the first microlens ML1 of the cross-sectional view 600b shown in FIG. 6B may have a higher height than the first microlens ML1 of the cross-sectional view 600a shown in FIG. 6A. In addition, the diagonal width W1_2 of the first microlens ML1 may be larger than the row-directional width W1_1 of the first microlens ML1.

When viewed in the cross-sectional view 600b of the pixel array taken along the second cutting line B-B', the first microlens ML1 may be formed to have a higher height than the second microlens ML2 by a predetermined height H2. For example, H2 may be set to 100 to 300 Å, and may be greater than H1 shown in FIG. 6A.

In FIG. 6B, a phase-difference detection pixel (PDPX) located at the left side will hereinafter be referred to as a first phase-difference detection pixel (PDPX1), and a phase-difference detection pixel (PDPX) located at the right side will hereinafter be referred to as a third phase-difference detection pixel (PDPX3).

In the case of using the phase signals of some phase-difference detection pixels (PDPXs) arranged in the diagonal direction from among the phase-difference detection pixels (PDPXs) sharing the first microlens ML1, the distance between some phase-difference detection pixels (PDPXs) reaches a maximum distance, such that the highest L/R ratio (or the highest R/L ratio) can be obtained.

In other words, in the case of using the phase signals detected by the first phase-difference detection pixel (PDPX1) and the third phase-difference detection pixel (PDPX3), the highest L/R ratio (or the highest R/L ratio) can be obtained.

Figure 7:
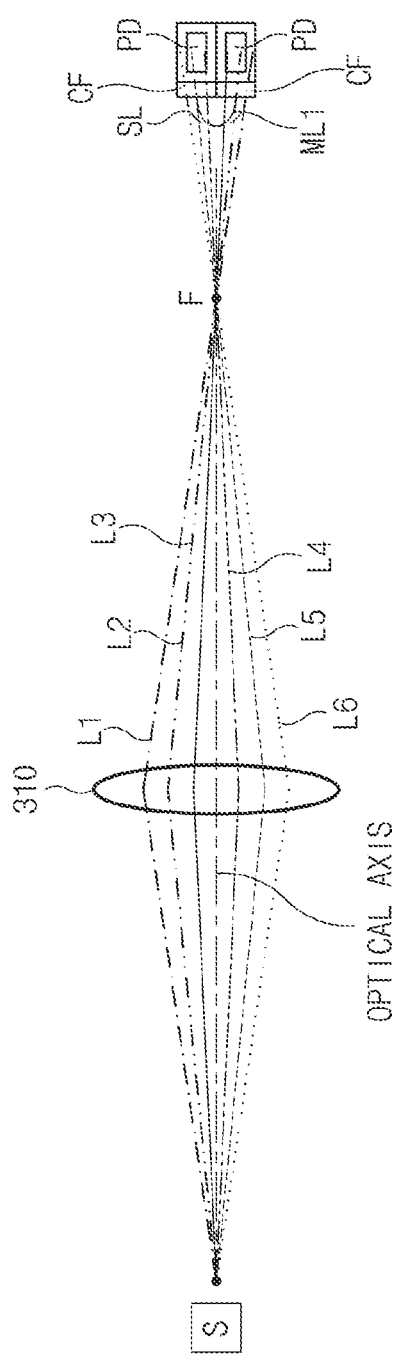
FIG. 7 is a conceptual diagram illustrating example paths of light rays incident upon phase-difference detection pixels (PDPXs) based on some implementations of the disclosed technology.

FIG. 7 is a conceptual diagram illustrating an example of the optical path of light incident upon phase-difference detection pixels (PDPXs) based on some implementations of the disclosed technology.

FIG. 7 illustrates a path of incident light that is incident upon the first microlens ML1 after being transferred from the object S to the lens 310. For comparison with the first microlens ML1, FIG. 7 illustrates the spherical microlens SL as well as the first microlens ML1.

Although FIG. 7 is merely a conceptual diagram for better understanding of technical characteristics of the disclosed technology, the scope or spirit of the disclosed technology is not limited thereto, and it should be noted that the exemplary ratio between the lens 310 and the first microlens ML1 shown in FIG. 7 may be different from the ratio between the actual lens 310 and the first microlens ML1.

Each of L1 to L6 may denote the path of incident light, and 'F' may denote a focal point of the lens 310.

From among the plurality of incident lights starting from the object (S), only some incident lights, each of which has a smaller angle of incidence than the incident lights L1 and L6 with respect to the optical axis, can be directed to the photoelectric conversion element (PD) by the spherical microlens SL. Here, the term "angle of incidence" may refer to the angle between the optical axis of the lens 310 and the incident light.

On the other hand, only some incident lights, each of which has a smaller angle of incidence than the incident lights L2 and L5 with respect to the optical axis, can be directed to the photoelectric conversion element (PD) by the first microlens ML1.

Accordingly, the amount of incident light that arrives at the photoelectric conversion element (PD) after passing through the first microlens ML1 may be less than the amount of incident light passing through the spherical microlens SL.

As the amount of incident light that arrives at the photoelectric conversion element (PD) after passing through the first microlens ML1 decreases, the sensitivity of the phase-difference detection pixel (PDPX) can be adjusted.

Figure 8A:
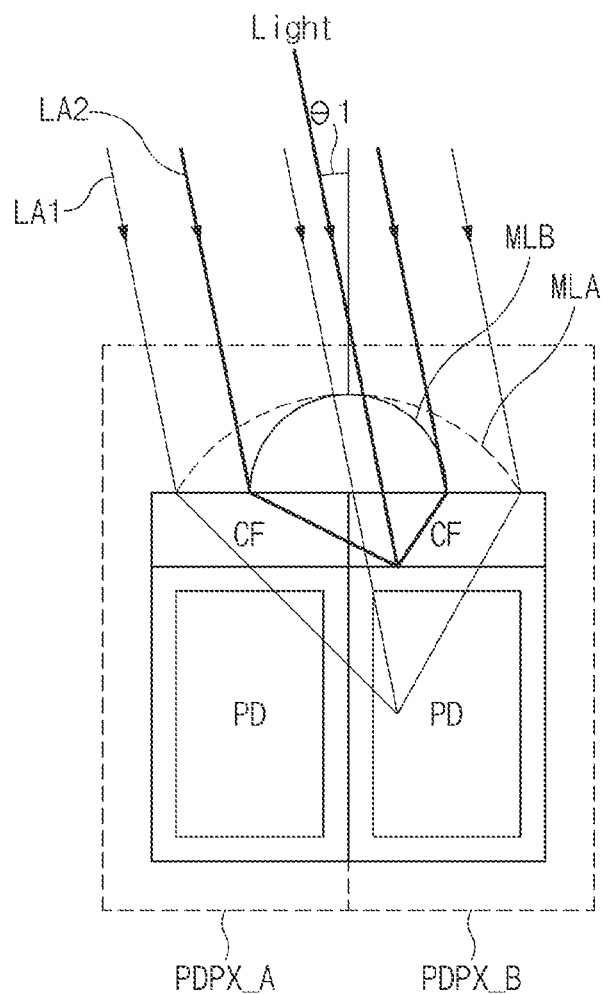
FIG. 8A illustrates light rays incident upon phase-difference detection pixels (PDPXs) at a first angle ($\theta 1$).
Figure 8B:
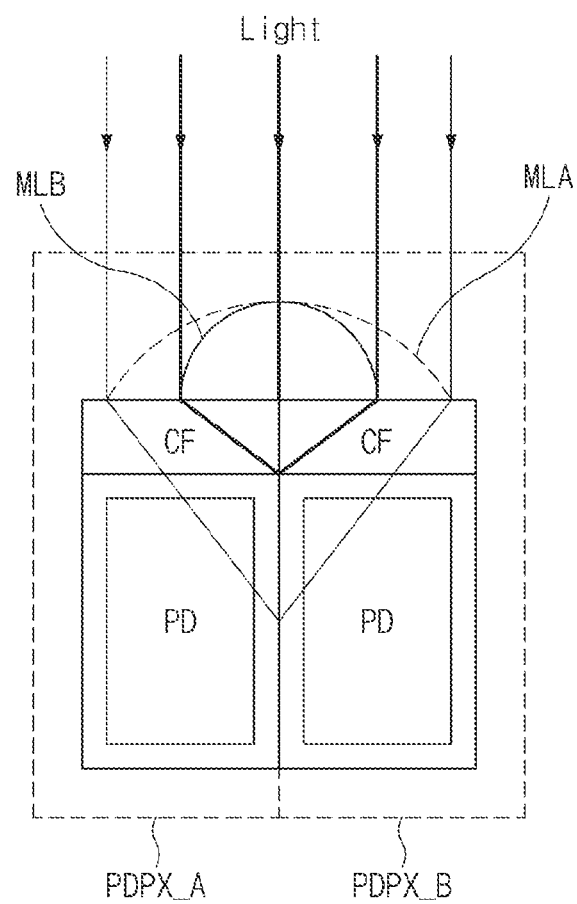
FIG. 8B illustrates light rays incident upon phase-difference detection pixels (PDPXs) at a right angle.
Figure 8C:
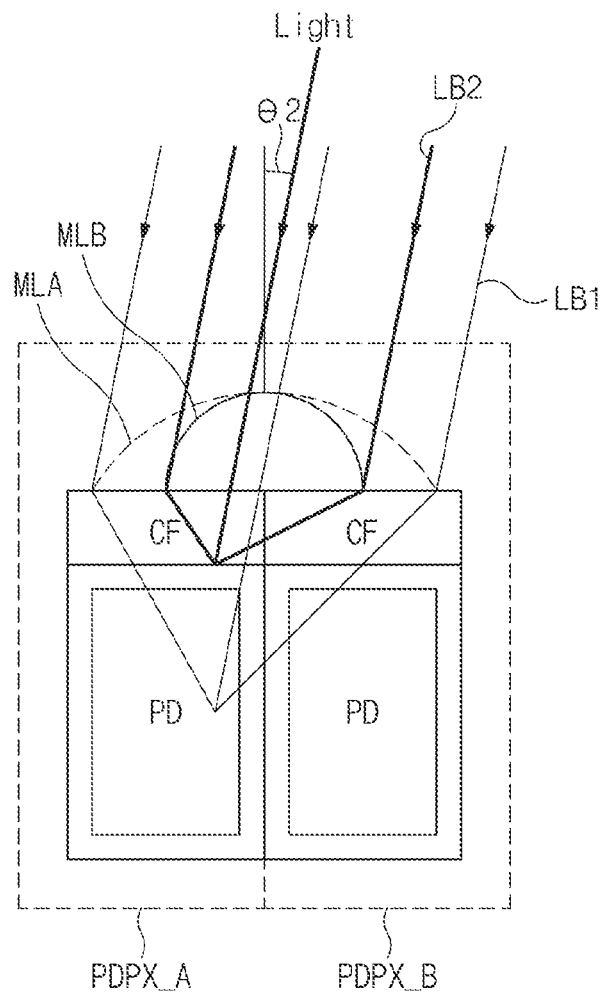
FIG. 8C illustrates light rays incident upon phase-difference detection pixels (PDPXs) at a second angle ($\theta 2$).

FIG. 8A illustrates light rays incident upon phase-difference detection pixels (PDPXs) at a first angle (θ1). FIG. 8B illustrates light rays incident upon phase-difference detection pixels (PDPXs) at a right angle. FIG. 8C illustrates light rays incident upon phase-difference detection pixels (PDPXs) at a second angle (θ2). FIGS. 8A, 8B, and 8C show why the L/R ratio (or R/L ratio) is improved in proportion to the increase in the curvature of a microlens based on some implementations of the disclosed technology. In FIGS. 8A, 8B, and 8C, a phase-difference detection pixel (PDPX) located at the left side from among the phase-difference detection pixels (PDPXs) may hereinafter be referred to as a phase-difference detection pixel A (PDPX_A), and a phase-difference detection pixel (PDPX) located at the right side from among the phase-difference detection pixels (PDPXs) may hereinafter be referred to as a phase-difference detection pixel B (PDPX_B).

FIG. 8A is a schematic diagram illustrating the incident light that is incident upon the optical axes of the microlenses MLA and MLB at a first angle (θ1). FIG. 8B is a schematic diagram illustrating the incident light that is incident upon the optical axes of the microlenses MLA and MLB at a specific angle (0°) indicating a parallel situation in which the incident light is incident in parallel to the optical axes of the microlenses MLA and MLB. FIG. 8C is a schematic diagram illustrating the incident light that is incident upon the optical axes of the microlenses MLA and MLB at a second angle (θ2).

In this case, the first angle (θ1) is located at the left side with respect to the optical axis of each microlens, so that the first angle (θ1) may be set to a negative (−) angle. The second angle (θ2) is located at the right side with respect to the optical axis of each microlens, so that the second angle (θ2) may be set to a positive (+) angle.

As described above, the ratio between the phase signals detected by the phase-difference detection pixels (PDPXs) sharing the same microlens may be referred to as the L/R ratio (or R/L ratio).

The phase-difference detection pixel A (PDPX_A) or the phase-difference detection pixel B (PDPX_B) may share the microlens A (MLA), or may share the other microlens B (MLB) that has a higher curvature than the microlens A (MLA).

Each of the phase-difference detection pixel A (PDPX_A) and the phase-difference detection pixel B (PDPX_B) may include the optical filter (CF) and the photoelectric conversion element (PD).

The relationship between the microlens A (MLA) and the microlens B (MLB) may be substantially identical to the relationship between the spherical microlens SL and the first microlens ML1 shown in FIGS. 3 to 7.

Referring to FIGS. 8A, 8B, and 8C, the incident light having penetrated the microlens A (MLA) may be focused at a relatively deeper position with respect to the phase-difference detection pixels (PDPXs) PDPX_A and PDPX_B.

On the other hand, the incident light having penetrated the microlens B (MLB) may be focused at a relatively shallower position with respect to the phase-difference detection pixels (PDPXs) PDPX_A and PDPX_B. This is because a focal length of the microlens A (MLA) is longer than a focal length of the microlens B (MLB).

Referring to FIG. 8A, the incident light A1 (LA1) having penetrated the microlens A (MLA) having a relatively smaller curvature may be focused on the phase-difference detection pixel B (PDPX_B) after passing through some parts of the phase-difference detection pixel A (PDPX_A).

On the other hand, the incident light A2 (LA2) having penetrated the microlens B (MLB) having a relatively higher curvature may be focused on the phase-difference detection pixel B (PDPX_B) without passing through the phase-difference detection pixel A (PDPX_A).

If the incident light is focused after passing through all of the adjacent phase-difference detection pixels (PDPXs) PDPX_A and PDPX_B, the phase signals generated by the phase-difference detection pixel PDPX_A and PDPX_B in response to the incident light may be incompletely separated from each other.

In other words, when the microlens having a long focal length is used, the incident light having penetrated the microlens may affect all of the phase signals of the adjacent phase-difference detection pixels PDPX_A and PDPX_B. Therefore, if the phase signals are incompletely separated from each other, the measured L/R ratio (or R/L ratio) of each pixel may be relatively low.

In contrast, when the microlens having a high curvature is used, the incident light having penetrated the microlens may affect only one phase signal detected by one phase-difference detection pixel (PDPX) from among the adjacent phase-difference detection pixels PDPX_A and PDPX_B. Therefore, the higher the curvature of the microlens, the higher the L/R ratio (or R/L ratio).

FIG. 8B is a conceptual diagram illustrating an exemplary implementation in which the incident light is incident in parallel to the optical axis (i.e., at an angle (0°) of incidence). As a result, the same phase signals are detected by the adjacent phase-difference detection pixels PDPX_A and PDPX_B as illustrated in FIG. 8B. In this case, the incident light that is incident in parallel to the optical axis may have a symmetrical optical path with respect to light that is incident upon the adjacent phase-difference detection pixels PDPX_A and PDPX_B.

Referring to FIG. 8C, the incident light B1 (LB1) having penetrated the microlens A (MLA) having a relatively low curvature may pass through some parts of the phase-difference detection pixel B (PDPX_B), and then the incident light B1 (LB1) may be focused on the phase-difference detection pixel A (PDPX_A).

On the other hand, the incident light B2 (LB2) having penetrated the microlens B (MLB) having a relatively high curvature may be focused on the phase-difference detection pixel A (PDPX_A) without passing through the phase-difference detection pixel B (PDPX_B).

As can be seen from FIG. 8C, although the incident light has a positive(+) angle of incidence, it can be recognized that the L/R ratio (or R/L ratio) is gradually improved in proportion to the increasing curvature of the microlens in the same manner as in the other case in which the incident light has a negative(−) angle of incidence.

Figure 9:
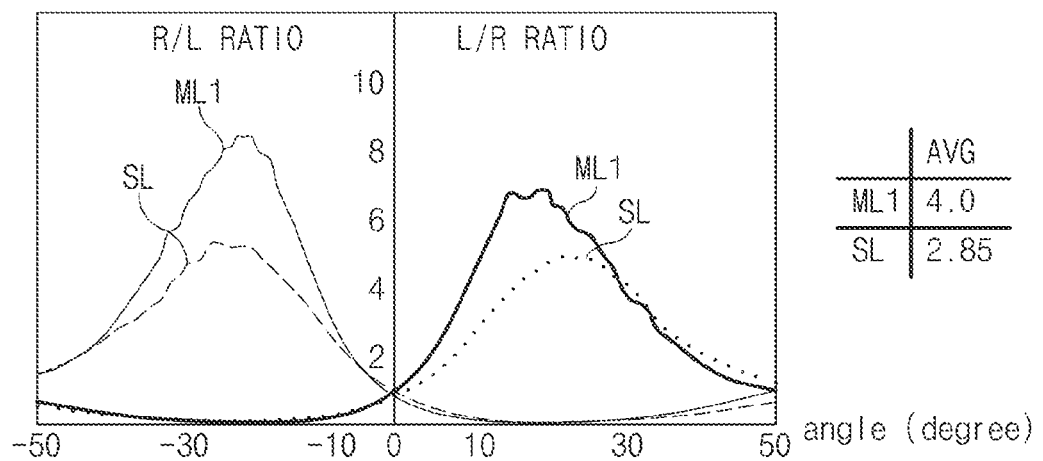
FIG. 9 illustrates example plots of a left/right (L/R) ratio (and a right/left (R/L) ratio) of phase-difference detection pixels (PDPXs) sharing a first microlens, and a left/right (L/R) ratio (and a right/left (R/L) ratio) of phase-difference detection pixels (PDPXs) sharing a spherical microlens based on some implementations of the disclosed technology.

FIG. 9 illustrates example plots of the L/R ratio (and R/L ratio) of the phase-difference detection pixels (PDPXs) sharing the first microlens ML1 and the L/R ratio (and R/L ratio) of the phase-difference detection pixels (PDPXs) sharing the spherical microlens SL based on some implementations of the disclosed technology.

In FIG. 9, a horizontal axis of the graph may denote a degree (angle), and "L/R RATIO" or "R/L RATIO" may denote the magnitude ratio of signals so that no unit is depicted in a vertical axis of the graph.

As shown in the graph of FIG. 9, it can be recognized that the L/R ratio (and R/L ratio) of the phase-difference detection pixels (PDPXs) sharing the first microlens ML1 is higher than the L/R ratio (and R/L ratio) of the phase-difference detection pixels (PDPXs) sharing the spherical microlens SL.

In more detail, an average value of the L/R ratio (and R/L ratio) of the phase-difference detection pixels (PDPXs) sharing the first microlens ML1 may be set to 4, an average value of the L/R ratio (and R/L ratio) of the phase-difference detection pixels (PDPXs) sharing the spherical microlens SL may be set to 2.85, such that it can be recognized that the L/R ratio (and R/L ratio) of the phase-difference detection pixels (PDPXs) sharing the first microlens ML1 is improved by about 1.4 times as compared to the L/R ratio (and R/L ratio) of the phase-difference detection pixels (PDPXs) sharing the spherical microlens SL.

Figure 10:
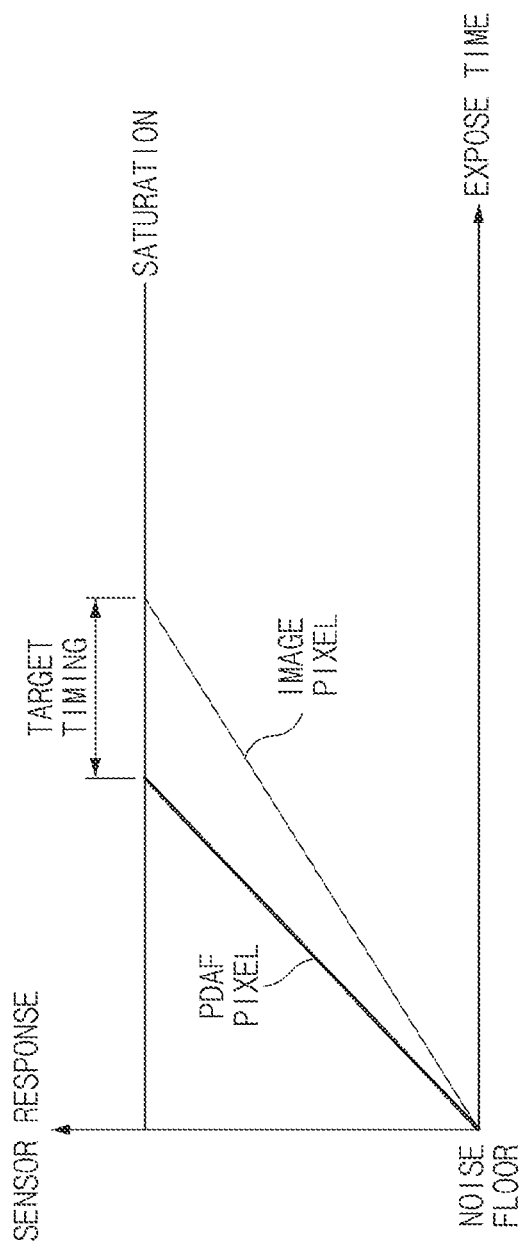
FIG. 10 illustrates an example of a saturation curve of phase-difference detection pixels (PDPXs) sharing the spherical microlens SL and a saturation curve of image detection pixels (IPXs) based on some implementations of the disclosed technology.

FIG. 10 illustrates an example of a saturation curve of phase-difference detection pixels (PDPXs) sharing the spherical microlens SL and a saturation curve of image detection pixels (IPXs) based on some implementations of the disclosed technology.

In FIG. 10, each of the phase-difference detection pixel (PDPX) and the image detection pixel (IPX) may include the optical filter (e.g., the second optical filter G) corresponding to the same color.

A slope change of the saturation curve "PDAF PIXEL" of the phase-difference detection pixel (PDPX) with respect to a light exposure time "EXPOSE TIME" may be about 1.3 times larger than a slope change of the other saturation curve "IMAGE PIXEL" of the image detection pixel (IPX) with respect to a light exposure time "EXPOSE TIME".

The slope of the saturation curve of each pixel may refer to the sensitivity. Accordingly, the sensitivity of the phase-difference detection pixels (PDPXs) sharing the spherical microlens SL may be about 1.3 times higher than the sensitivity of the image detection pixels (IPXs). As described above, a difference in sensitivity between the phase-difference detection pixel (PDPX) and the image detection pixel (IPX) may occur due to a difference in shape between the first microlens ML1 and the second microlens ML2.

In a situation in which the sensitivity of the phase-difference detection pixel (PDPX) is greater than the sensitivity of the image detection pixel (IPX), whereas it is impossible to calculate a phase difference using the phase signal detected by the phase-difference detection pixel (PDPX), an operation section "TARGET TIMING" in which the image detection pixel (IPX) is activated may occur.

In some implementation, the shape of the first microlens ML1 configured to overlap with the phase-difference detection pixel (PDPXs) may be adjusted to remove the above-mentioned operation section "TARGET TIMING".

Figure 11:
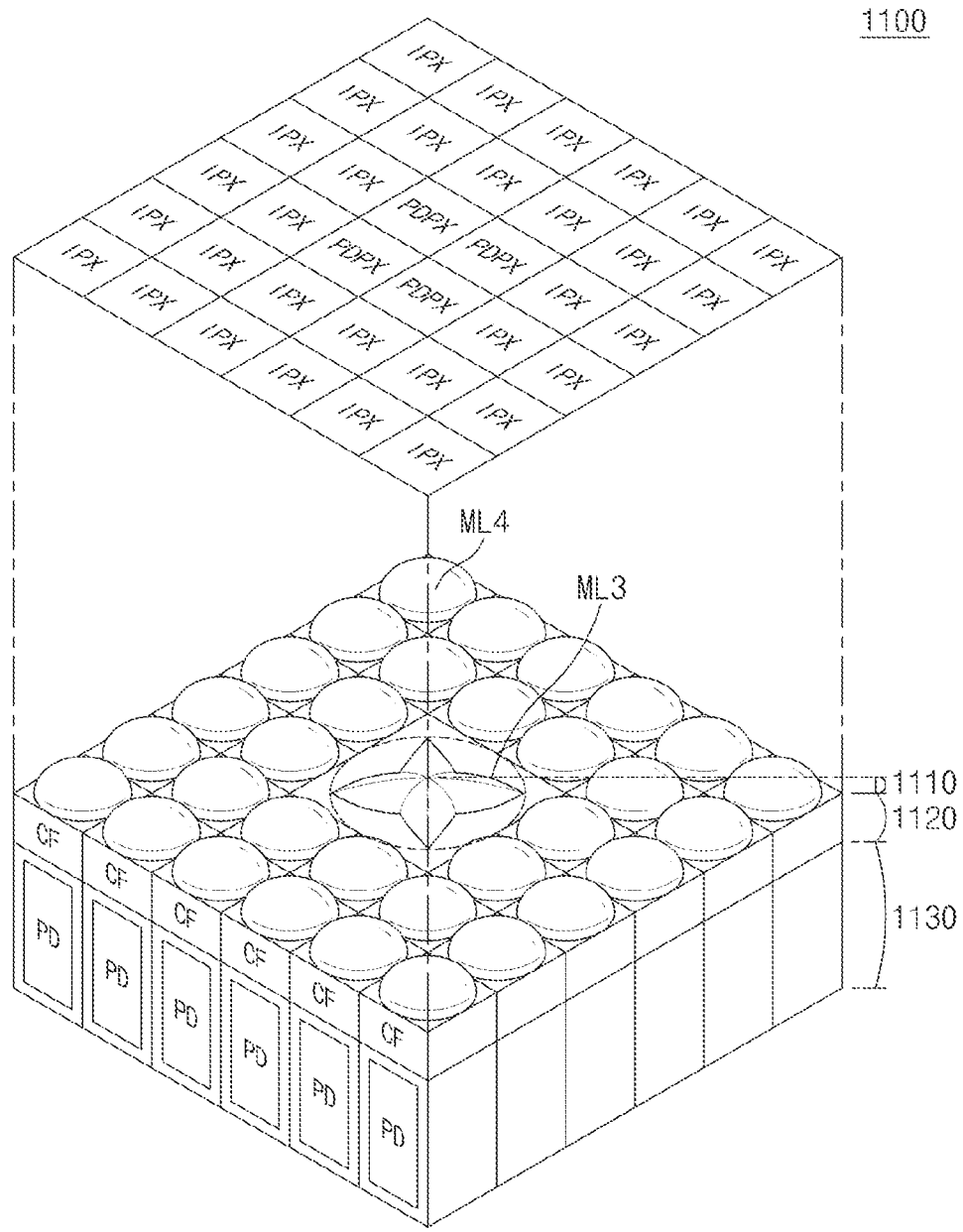
FIG. 11 is a perspective view illustrating an example of a pixel array based on some other implementations of the disclosed technology.

FIG. 11 is a perspective view illustrating an example of a pixel array 1100 based on some other implementations of the disclosed technology. In the same manner as in FIG. 3, the pixel array 1100 shown in FIG. 11 may include a plurality of phase-difference detection pixels (PDPXs) and a plurality of image detection pixels (IPXs), and the above-mentioned pixels PDPXs and IPXs may be arranged in a matrix.

The pixel array 1100 may include a microlens array 1110, an optical filter array 1120, a photoelectric conversion element array 1130, and a wiring layer (not shown). Here, the microlens array 1110 may include a third microlens ML3 and one or more fourth microlenses ML4. The third microlens ML3 can be shared by two or more phase-difference detection pixels (PDPXs) arranged in the 2×2 matrix array and is used to direct light to the PDPXs. The optical filter array 1120 may include a plurality of optical filters (CFs). The photoelectric conversion element array 1130 may include a plurality of photoelectric conversion elements (PDs).

The phase-difference detection pixels (PDPXs) arranged in the (2×2) matrix may include at least a portion of only one third microlens ML3. In other words, the phase-difference detection pixels (PDPXs) arranged in the (2×2) matrix may share only one microlens ML3.

Each image detection pixel (IPX) may include one fourth microlens ML4. In more detail, the image detection pixels (IPXs) may be arranged in one-to-one correspondence with the fourth microlenses (ML4s). The fourth microlens ML4 shown in FIG. 11 may be identical in shape to the second microlens ML2 shown in FIGS. 3 and 6.

In another implementation of the disclosed technology, the remaining parts of the pixel array 1100 other than the shape of the third microlens ML3 may be substantially identical in shape to the pixel array 400 shown in FIG. 3, and as such redundant description thereof will herein be omitted for brevity.

The third microlens ML3 shared by the phase-difference detection pixels (PDPXs) may be formed to have a center thickness that is greater than that of the fourth microlens ML4. Thus, the amount of incident light collected by the third microlens ML3 may be greater than the amount of incident light collected by the fourth microlens ML4.

As described above, the shape of the third microlens ML3 may be changed to adjust the sensitivity of the phase-difference detection pixel (PDPX).

In another implementation of the disclosed technology, the third microlens ML3 includes a center and four portions that extends from the center to a direction diagonal to the row or column direction in the 2×2 matrix array of the four phase-difference detection pixels (PDPXs). The center of the third microlens ML3 is located over a center of the 2×2 matrix array of the four phase-difference detection pixels (PDPXs) and is thicker than other portions of the third microlens ML3. In one example, each of the four portions extending to a direction diagonal to the row or column axes tapers toward one end with the other end connected to the center. In some implementations, the width of the third microlens ML3 in the row and column directions of the pixel array 1100 may be smaller than the width of the third microlens ML3 in the direction diagonal to the row and column directions of the pixel array 1100.

Since the third microlens ML3 have a smaller width in the row and column directions of the pixel array 1100 as described above, the amount of incident light that arrives at the photoelectric conversion element (PD) of the phase-difference detection pixel (PDPX) may be reduced.

Since the amount of incident light that arrives at the photoelectric conversion element (PD) of the phase-difference detection pixel (PDPX) is reduced as described above, the sensitivity of the image sensor 100 can be adjusted.

Figure 12:
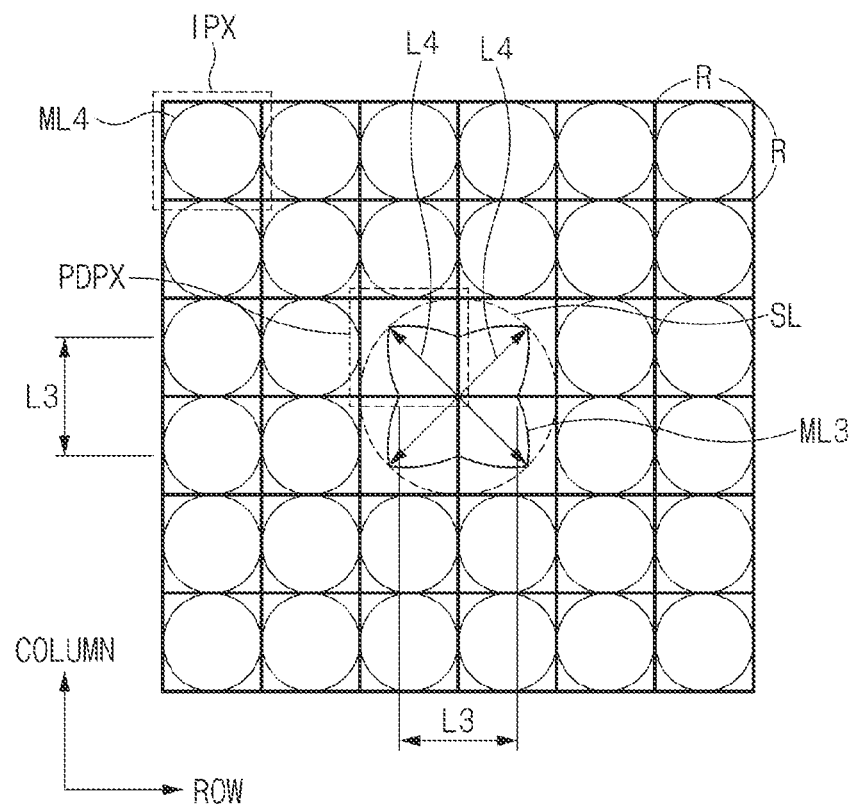
FIG. 12 is a top view illustrating an example of a pixel array based on some other implementations of the disclosed technology.

FIG. 12 is a top view illustrating an example of the pixel array 1100 based on some other implementations of the disclosed technology.

Referring to FIG. 12, for convenience of description and better understanding of the disclosed technology, it is assumed that each pixel PDPX or IPX of the pixel array 1100 is formed in a square shape in which the width of the row direction is set to R and the width of the column direction is also set to R. However, the scope or spirit of the disclosed technology is not limited thereto, and each pixel IPX or PDPX may also be formed in a diamond shape, a hexagonal shape, or others.

Assuming that the microlens is implemented as a spherical microlens SL that has the radius R of a bottom surface thereof and overlaps with the phase-difference detection pixels (PDPXs) constructing the (2×2) matrix, the bottom surface of the spherical microlens is denoted by "SL."

The remaining parts of the pixel array 1100 other than the third microlens ML3 different in shape from the first microlens ML1 of the pixel array 400 shown in FIG. 3 may be substantially identical in shape to the pixel array 400 shown in FIG. 3, and as such redundant description thereof will herein be omitted for brevity.

The third microlens ML3 may be symmetric in shape based on a boundary line between the phase-difference detection pixels (PDPXs) that include at least a portion of the third microlens ML3 and are vertically arranged in the (2×2) matrix.

In addition, the third microlens ML3 may be symmetric in shape based on the boundary line between the phase-difference detection pixels (PDPXs) that include at least a portion of the third microlens ML3 and are horizontally arranged in the (2×2) matrix.

A straight line, which passes through the center point of the (2×2) matrix, extends in the row or column direction of the pixel array 1100, and overlaps with the bottom surface of the third microlens ML3, will hereinafter be referred to as a third straight line L3. For example, the third straight line L3 may be shorter in length than 2R.

In addition, a straight line, which passes through the center point of the (2×2) matrix, extends in the direction diagonal to the row or column direction of the pixel array 1100, and overlaps with the bottom surface of the third microlens ML3, will hereinafter be referred to as a fourth straight line L4. Here, the length of the fourth straight line L4 may be denoted by 2R.

For example, the length of the third straight line L3 may be 0.95 to 0.5 times the length of the fourth straight line L4.

Since the third straight line L3 is shorter in length than the fourth straight line L4, the region of the bottom surface of the third microlens ML3 for only one phase-difference detection pixel (PDPX) may be smaller in size than the region of the bottom surface of the fourth microlens ML4 for only one image detection pixel (IPX).

In other words, the above-mentioned situation in which the third straight line L3 is shorter in length than the fourth straight line L4 may indicate that the bottom surface of the third microlens ML3 is concavely curved toward the center point of the (2×2) matrix in the direction of the third straight line L3 (i.e., in the row and column directions of the pixel array 1100).

Referring to FIG. 12, the third microlens ML3 is concavely curved in the row and column directions of the pixel array 1100 as compared to the spherical microlens SL, the region of the bottom surface of the third microlens ML3 for only one phase-difference detection pixel (PDPX) may be smaller than $$\frac{R^2}{4} * \pi.$$

In contrast, the region of the bottom surface of the fourth microlens ML4 for only one image detection pixel (IPX) may be denoted by $$\frac{R^2}{4} * \pi.$$

In addition, since the third straight line L3 is shorter in length than the fourth straight line L4, the curvature of the third microlens ML3 in the row or column direction of the pixel array 1100 may be greater than the curvature of the third microlens ML3 in the direction diagonal to the row or column direction of the pixel array 1100.

As described above, the higher the curvature of each lens, the higher the L/R ratio. Therefore, in the image sensor 100 including the third microlens ML3, the L/R ratio (or R/L ratio) of the phase signal detected by the phase-difference detection pixels (PDPXs) arranged in the row or column direction may be higher than the L/R ratio (or R/L ratio) of the phase signals detected by the phase-difference detection pixels (PDPXs) arranged in the diagonal direction.

As is apparent from the above description, the image sensing device based on some implementations of the disclosed technology can be configured to implement an improved phase-difference detection autofocus (PDAF) function.

The embodiments of the disclosed technology may provide a variety of effects capable of being directly or indirectly recognized through the above-mentioned patent document.

Those skilled in the art will appreciate that the disclosed technology may be carried out in other specific ways than those set forth herein. In addition, claims that are not explicitly presented in the appended claims may be presented in combination as an embodiment or included as a new claim by a subsequent amendment after the application is filed.

Although a number of illustrative embodiments have been described, it should be understood that numerous other modifications and embodiments can be devised based on what is described and/or illustrated in this patent document.

What is claimed is:

1. An image sensing device comprising:
    a pixel array including a plurality of image detection pixels structured to convert light incident onto the image detection pixels into pixel signals representing an image of an object;
    a plurality of phase-difference detection pixels in the pixel array structured to detect light from the object to generate a phase signal for measuring a distance between the image sensing device and the object; and
    a first lens positioned to direct light to the plurality of phase-difference detection pixels, the first lens being shared by the plurality of phase-difference detection pixels and including a plurality of portions each corresponding to at least one of the plurality of phase-difference detection pixels,
    wherein a center of the first lens is located over a center of the plurality of phase-difference detection pixels, and each of the plurality of portions of the first lens extends from the center of the first lens along a row or column direction between adjacent phase-difference detection pixels or along diagonal directions between the row and column directions,
    wherein each of the plurality of phase-difference detection pixels are arranged in a (2×2) matrix and corresponds to at least a portion of the first lens,
    wherein the row or column direction includes a first straight line passing through a center of the (2×2) matrix and overlapping with a bottom surface of the first lens, and the diagonal directions include a second straight line passing through the center of the (2×2) matrix and overlapping with the bottom surface of the first lens, and
    wherein a length of the first straight line is longer than a length of the second straight line.

2. The image sensing device according to claim 1, wherein the length of the second straight line is within a range from 0.95 to 0.5 times the length of the first straight line.

3. The image sensing device according to claim 1, wherein the phase-difference detection pixels include optical filters formed below the first lens, and wherein the optical filters include at least one of a red color filter, a green color filter and a blue color filter.

4. The image sensing device according to claim 3, wherein at least one of the optical filters formed below the first lens is different from the other optical filters formed below the first lens.

5. The image sensing device according to claim 3, wherein at least one of the optical filters formed below the first lens is the same as the other optical filters formed below the first lens.

6. The image sensing device according to claim 1, wherein the image detection pixels are arranged adjacent to the (2×2) matrix in the pixel array.

7. The image sensing device according to claim 1, further comprising a plurality of second lenses arranged over the plurality of image detection pixels.

8. The image sensing device according to claim 7, wherein the first lens has a center thickness that is greater than a center thickness of the second lens.

9. The image sensing device according to claim 8, wherein the center thickness of the first lens is greater than the center thickness of the second lens by 100 to 300 Å.

10. The image sensing device according to claim 7, wherein each of the plurality of image detection pixels includes an optical filter formed below the second lens, and wherein the optical filter is any one of a red color filter, a green color filter and a blue color filter.

11. The image sensing device according to claim 10, wherein the optical filter further includes a light shielding structure disposed between the phase-difference detection pixel and the image detection pixel and disposed between the image detection pixels.

12. The image sensing device according to claim 11, wherein the light shielding structure includes tungsten W.

13. An image sensing device comprising:
    a pixel array including a plurality of phase-difference detection pixels arranged in a (2×2) matrix and structured to detect light from an object to generate a phase signal that carries information for a distance between the image sensing device and the object; and
    a first lens located to direct light to the plurality of phase-difference detection pixels, the first lens being shared by the plurality of phase-difference detection pixels and including a plurality of portions each corresponding to at least one of the plurality of phase-difference detection pixels,
    wherein a center of the first lens is located over a center of the (2×2) matrix, and a bottom surface of the first lens is concavely curved toward the center of the first lens, and
    wherein each of the plurality of portions of the first lens extends from the center of the first lens along a row or column direction between adjacent phase-difference detection pixels or along diagonal directions between the row and column directions, wherein the row or column direction includes a first straight line passing through a center of the (2×2) matrix and overlapping with a bottom surface of the first lens, and the diagonal directions include a second straight line passing through the center of the (2×2) matrix and overlapping with the bottom surface of the first lens, and
    wherein a length of the first straight line is longer than a length of the second straight line.

14. The image sensing device according to claim 13, wherein each of the plurality of portions of the first lens extends from the center of the first lens along a row direction and a column direction between adjacent phase-difference detection pixels.

* * * * *